(12) United States Patent
Yamazaki et al.

(10) Patent No.: US 8,324,621 B2
(45) Date of Patent: Dec. 4, 2012

(54) SEMICONDUCTOR DEVICE HAVING OXIDE SEMICONDUCTOR LAYER

(75) Inventors: Shunpei Yamazaki, Setagaya (JP); Junichiro Sakata, Atsugi (JP); Kengo Akimoto, Atsugi (JP); Kosei Noda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 12/899,962

(22) Filed: Oct. 7, 2010

(65) Prior Publication Data

US 2011/0084271 A1 Apr. 14, 2011

(30) Foreign Application Priority Data

Oct. 14, 2009 (JP) .................................. 2009-236780

(51) Int. Cl.
*H01L 29/12* (2006.01)

(52) U.S. Cl. ............ 257/43; 257/59; 257/763; 257/766; 257/E29.068; 257/E33.053

(58) Field of Classification Search .................. 257/766, 257/763, 59, 43, E29.068, E33.053
See application file for complete search history.

(56) References Cited

U.S. PATENT DOCUMENTS

| | | | |
|---|---|---|---|
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,297,977 B2 | 11/2007 | Hoffman et al. | |
| 7,298,084 B2 | 11/2007 | Baude et al. | |
| 7,323,356 B2 | 1/2008 | Hosono et al. | |

(Continued)

FOREIGN PATENT DOCUMENTS

EP 1737044 A 12/2006

(Continued)

OTHER PUBLICATIONS

Fortunato.E et al., "Wide-Bandgap High-Mobility ZNO Thin-Film Transistors Produced At Room Temperature,", Appl. Phys. Lett. (Applied Physics Letters), Sep. 27, 2004, vol. 85, No. 13, pp. 2541-2543.

(Continued)

*Primary Examiner* — Marc Armand
(74) *Attorney, Agent, or Firm* — Eric J. Robinson; Robinson Intellectual Property Law Offic, P.C.

(57) ABSTRACT

Disclosed is a highly reliable semiconductor device and a manufacturing method thereof, which is achieved by using a transistor with favorable electrical characteristics and high reliability as a switching element. The semiconductor device includes a driver circuit portion and a pixel portion over one substrate, and the pixel portion comprises a light-transmitting bottom-gate transistor. The light-transmitting bottom-gate transistor comprises: a transparent gate electrode layer; an oxide semiconductor layer over the gate electrode layer, a superficial layer of the oxide semiconductor layer including comprising a microcrystal group of nanocrystals; and source and drain electrode layers formed over the oxide semiconductor layer, the source and drain electrode layers comprising a light-transmitting oxide conductive layer.

25 Claims, 13 Drawing Sheets

U.S. PATENT DOCUMENTS

| | | |
|---|---|---|
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,719,185 B2 | 5/2010 | Jin et al. |
| 7,732,819 B2 | 6/2010 | Akimoto et al. |
| 7,745,798 B2 | 6/2010 | Takahashi |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1* | 11/2007 | Kim et al. ........................ 257/43 |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1* | 12/2008 | Akimoto et al. ................ 257/43 |
| 2009/0068773 A1 | 3/2009 | Lai et al. |
| 2009/0072232 A1 | 3/2009 | Hayashi et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189155 A1 | 7/2009 | Akimoto |
| 2009/0189156 A1 | 7/2009 | Akimoto |
| 2009/0224239 A1* | 9/2009 | Wakita ........................... 257/43 |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044711 A1* | 2/2010 | Imai ............................... 257/59 |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0117999 A1 | 5/2010 | Matsunaga et al. |
| 2010/0123136 A1* | 5/2010 | Lee et al. ........................ 257/59 |
| 2010/0155717 A1 | 6/2010 | Yano et al. |
| 2011/0012105 A1 | 1/2011 | Yamazaki et al. |
| 2011/0012106 A1 | 1/2011 | Yamazaki et al. |
| 2011/0012112 A1 | 1/2011 | Yamazaki et al. |
| 2011/0012116 A1 | 1/2011 | Yamazaki et al. |
| 2011/0012117 A1 | 1/2011 | Yamazaki et al. |
| 2011/0012118 A1 | 1/2011 | Yamazaki et al. |
| 2011/0017995 A1 | 1/2011 | Yamazaki et al. |
| 2011/0031491 A1 | 2/2011 | Yamazaki et al. |
| 2011/0062436 A1 | 3/2011 | Yamazaki et al. |
| 2011/0068335 A1 | 3/2011 | Yamazaki et al. |
| 2011/0084266 A1 | 4/2011 | Yamazaki et al. |
| 2011/0108837 A1 | 5/2011 | Yamazaki et al. |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 | 9/1993 |
| JP | 08-264794 | 10/1996 |
| JP | 11-505377 | 5/1999 |
| JP | 2000-044236 A | 2/2000 |
| JP | 2000-150900 | 5/2000 |
| JP | 2002-076356 A | 3/2002 |
| JP | 2002-289859 A | 10/2002 |
| JP | 2003-029293 | 1/2003 |
| JP | 2003-086000 | 3/2003 |
| JP | 2003-086808 | 3/2003 |
| JP | 2004-103957 | 4/2004 |
| JP | 2004-273614 A | 9/2004 |
| JP | 2004-273732 A | 9/2004 |
| JP | 2007-081362 | 3/2007 |
| JP | 2007-096055 | 4/2007 |
| JP | 2007-123861 | 5/2007 |
| JP | 2007-163467 | 6/2007 |
| JP | 2007-171932 | 7/2007 |
| JP | 2007-250982 A | 9/2007 |
| JP | 2008-243928 A | 10/2008 |
| JP | 2009/099847 | 5/2009 |
| JP | 2009-265271 | 11/2009 |
| JP | 2010-098280 | 4/2010 |
| WO | WO 2004/114391 | 12/2004 |
| WO | WO 2007/108293 | 9/2007 |
| WO | WO 2008/117810 | 10/2008 |
| WO | WO 2008/126879 | 10/2008 |
| WO | WO 2008/126884 | 10/2008 |

OTHER PUBLICATIONS

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Hayashi.R et al., "42.1: Invited Paper; Improved Amorphous In—Ga—Zn—O TFTS,", SID Digest '08 : SID International Symposium Digest of Technical Papers, May 20, 2008, vol.39, pp. 621-624.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.

Asakuma.N et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Nomura.K et al., "Carrier transport in transparent oxide semiconductor with intrinsic structural randomness probed using single-crystalline InGaO3(ZnO)5 films, ", Appl. Phys. Lett. (Applied Physics Letters), Sep. 13, 2004, vol. 85, No. 11, pp. 1993-1995.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Van De Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Nakamura, M., "Synthesis of Homologous Compound with New Long-Period Structure,", Nirim Newsletter, Mar. 1, 1995, vol. 150, pp. 1-4.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122101-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Park.J et al., "Amorphous Indium—Gallium—Zinc Oxide TFTS and Their Application for Large Size AMOLED,", AM-FPD '08 Digest of Technical Papers, Jul. 2, 2008, pp. 275-278.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m = 3$, 4, and 5), $InGaO_3(ZnO)_3$, and $Ga_2O_3(ZnO)m$ ($m = 7$, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: the "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the $16^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-277.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 IN. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, 2009, pp. 395-398.

Lee et al., "Current Status of, Challenges to, and Perspective View of AM-OLED," IDW '06: Proceedings of the $13_{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Kikuchi et al., "Polymer-Stabilized Liquid Crystal Blue Phases," Nature Materials, Sep. 2, 2002, vol. 1, pp. 64-68.

Kimizuka et . al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C" Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and Its Blue Phase," Phys. Rev. A (Physical Review. A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

International Search Report (Application No. PCT/JP2010/065997) Dated Oct. 19, 2010.

Written Opinion (Application No. PCT/JP2010/065997) Dated Oct. 19, 2010.

* cited by examiner

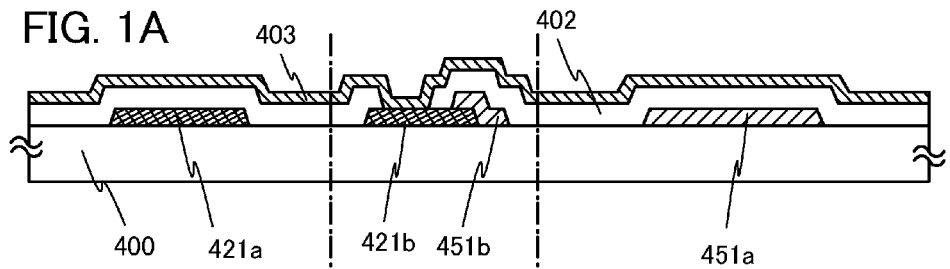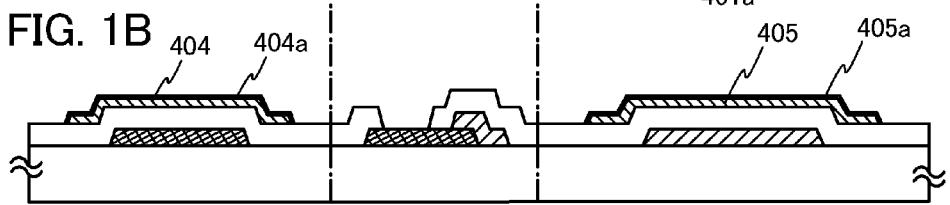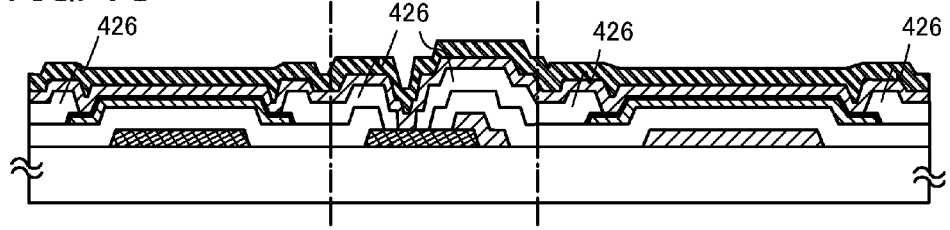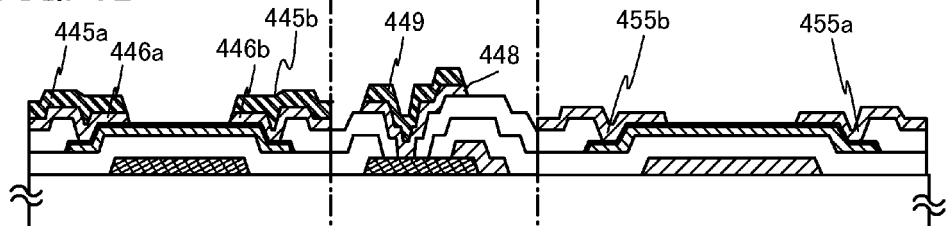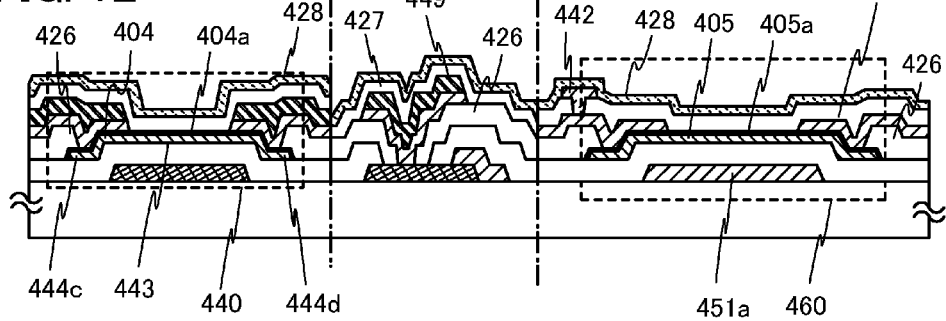

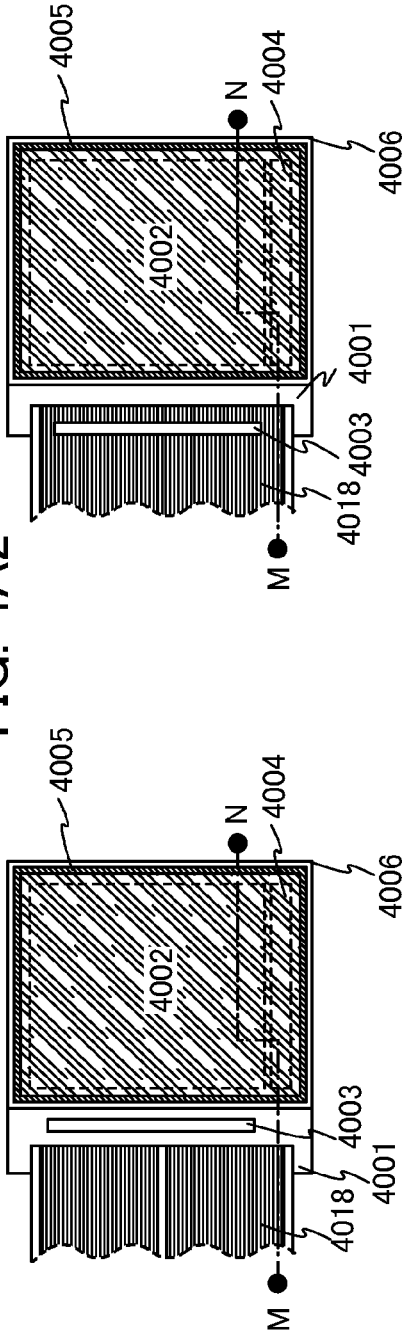
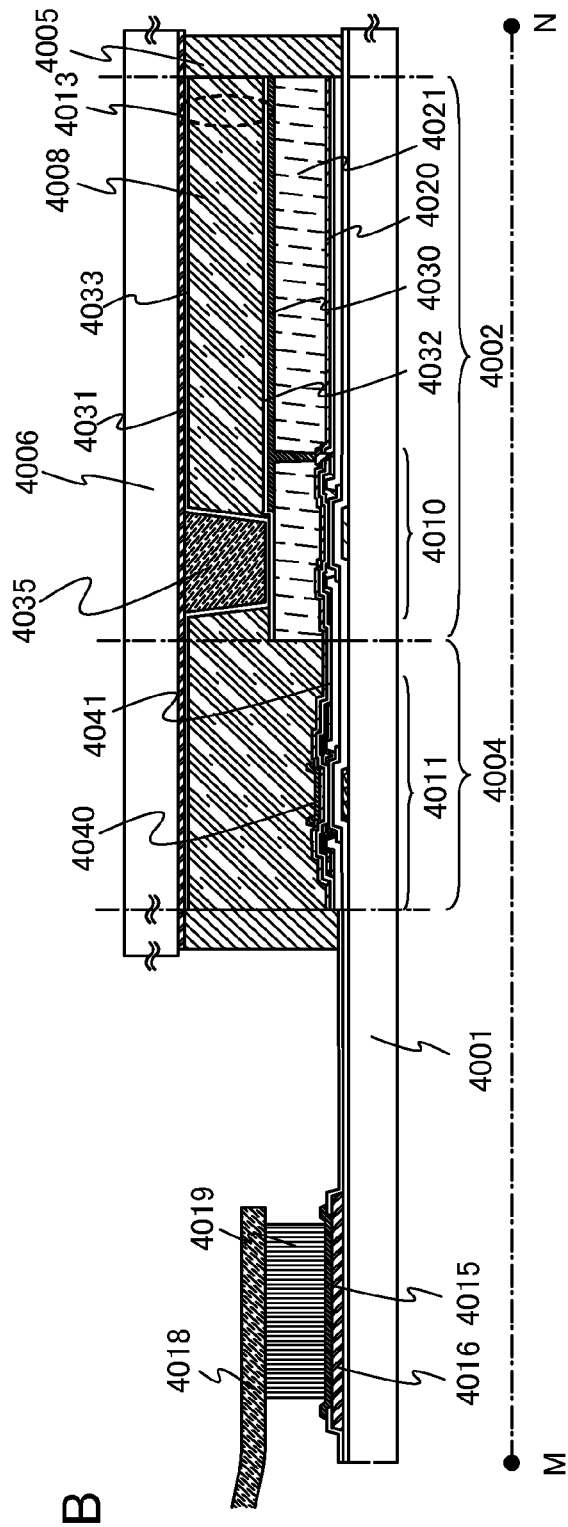

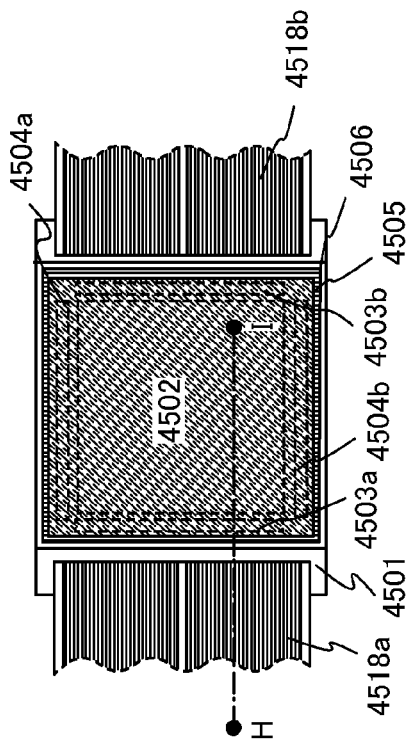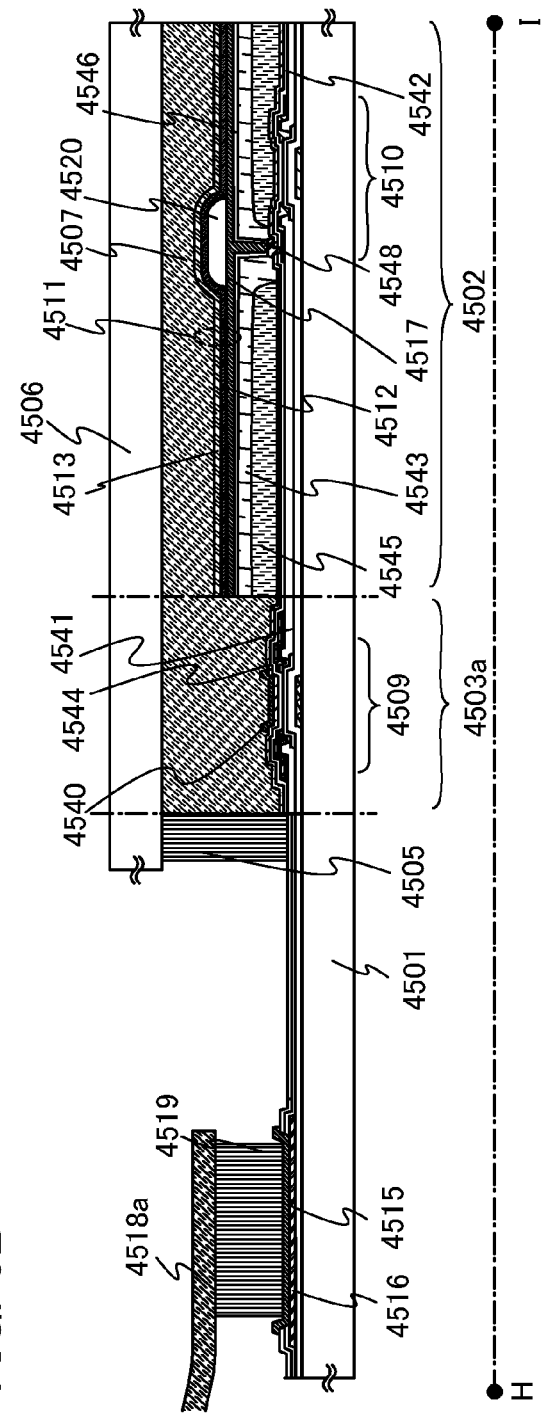
FIG. 6A
FIG. 6B

SEMICONDUCTOR DEVICE HAVING OXIDE SEMICONDUCTOR LAYER

TECHNICAL FIELD

The present invention relates to a semiconductor device including an oxide semiconductor.

Note that in this specification, a semiconductor device refers to any device that can function by utilizing semiconductor characteristics, and an electro-optical device such as a liquid crystal display device or a light-emitting device, a semiconductor circuit, and an electronic appliance are all semiconductor devices.

BACKGROUND ART

In recent years, a technique for forming transistors using a semiconductor thin film (with a thickness of several nanometers to several hundreds of nanometers) which is formed over a substrate having an insulating surface has attracted attention. Transistors have been widely applied to electronic devices such as an IC and an electro-optical device, and their development as particularly switching elements of image display devices has been hastened.

Metal oxides have been known as materials having semiconductor characteristics. The examples of such metal oxides having semiconductor characteristics are exemplified by tungsten oxide, tin oxide, indium oxide, zinc oxide, and the like. A transistor in which a channel formation region is formed using such metal oxides having semiconductor characteristics has been known (for example, see Patent Documents 1 and 2).

Transistors to which oxide semiconductors are applied have relatively high field effect mobility. Thus, a driver circuit for a display device or the like can be formed using the transistor including the oxide semiconductors.

[Reference]
[Patent Documents]
[Patent Document 1] Japanese Published Patent Application No. 2007-123861
[Patent Document 2] Japanese Published Patent Application No. 2007-096055

DISCLOSURE OF INVENTION

When a plurality of different circuits such as a pixel circuit (also referred to as a pixel portion) and a driver circuit are formed over an insulating surface, excellent switching characteristics such as a high on-off ratio are needed for a transistor used in the pixel circuit, and high operation speed is needed for a transistor used in the driver circuit. In particular, as the definition of a display portion is increased, writing time of a display image is required to be reduced. Therefore, it is preferable that the transistor used in the driver circuit operate at high speed. Besides, a display quality can be also improved by increasing the aperture ratio which is decreased in accordance with increase in the higher definition.

Therefore, it is an object of the present invention to solve the above-described problems. Specifically, the object of the present invention is to provide a semiconductor device which possesses an excellent switching characteristics, operates at high speed, and does not cause decrease in aperture ratio even if the definition of the display portion is increased.

An embodiment of the present invention is a semiconductor device including a driver circuit portion and a pixel portion formed using transistors over one substrate and a manufacturing method thereof. The transistor includes an oxide conductor in a source region and a drain region and a semiconductor layer formed using an oxide semiconductor.

An embodiment of the present invention is a semiconductor device comprising a pixel portion including a first transistor and a driver circuit portion including a second transistor over one substrate. The first transistor and the second transistor comprise: a gate electrode layer; a gate insulating layer over the gate electrode layer; an oxide semiconductor layer including a superficial layer which comprises a microcrystal group of nanocrystals, over the gate insulating layer; a source electrode layer and a drain electrode layer each overlapping with a part of the oxide semiconductor layer; and an oxide insulating layer which is in contact with the oxide semiconductor layer. A gate electrode layer, a source electrode layer, and a drain electrode layer of the first transistor are formed using an amorphous oxide conductor, and a gate electrode layer, a source electrode layer, and a drain electrode layer of the second transistor are formed using a metal.

Note that the ordinal numbers such as "first" and "second" in this specification are used for convenience and do not denote the order of steps or the stacking order of layers. In addition, the ordinal numbers in this specification do not denote particular names which specify the present invention.

In the above structure, the gate electrode layer, the source electrode layer, and the drain electrode layer of the first transistor can be formed using a light-transmitting material, whereby an aperture ratio can be increased.

The gate electrode layer, the source electrode layer, and the drain electrode layer of the second transistor can be a single film containing an element selected from Ti, Mo, W, Al, Cr, Cu, and Ta as a main component, an alloy film containing any of these elements, or a stacked film including any of the films.

An oxide conductive layer can be provided between the source electrode layer and the oxide semiconductor layer of the second transistor, and between the drain electrode layer and the oxide semiconductor layer of the second transistor. With this structure, the contact resistance can be reduced, which leads to a transistor capable of high-speed operation.

The oxide insulating layer formed over the oxide semiconductor layer of each of the first and second transistors can be formed using a silicon oxide film, a silicon nitride oxide film, an aluminum oxide film, an aluminum oxynitride film, or the like.

With the use of the transistor which is an embodiment of the present invention, a semiconductor device can be manufactured by forming a driver circuit portion and a pixel circuit portion over one substrate and using an EL element, a crystal liquid element, an electrophoresis element, or the like.

An embodiment of the present invention is a method for manufacturing a semiconductor device comprising the steps of: forming a first gate electrode layer and a second gate electrode layer over a substrate having an insulating surface; forming a gate insulating layer over the first gate electrode layer and the second gate electrode layer; forming a first oxide semiconductor layer and a second oxide semiconductor layer over the gate insulating layer; forming a microcrystal group of nanocrystals in superficial layers of the first oxide semiconductor layer and the second oxide semiconductor layer by heat treatment; forming an oxide conductive layer over the gate insulating layer, the first oxide semiconductor layer, and the second oxide semiconductor layer; forming a metal layer over the oxide conductive layer; etching selectively the metal layer and the oxide conductive layer, so that a first source electrode layer and a first drain electrode layer comprising the oxide conductive layer are each formed so as to overlap with part of the first oxide semiconductor layer, and a second source electrode layer and a second drain electrode layer comprising a stack of the oxide conductive layer and the metal layer are each formed so as to overlap with part of the second oxide semiconductor layer; and forming an oxide insulating layer over the first oxide semiconductor layer, the second oxide semiconductor layer, the first source electrode layer, the first drain electrode layer, the second source electrode layer, and the second drain electrode layer.

An embodiment of the present invention is an inverted staggered bottom gate transistor. The source electrode layer, the drain electrode layer, and a channel region are formed by etching a part of the oxide conductive layer. At that time, it is preferable to use mixed acid including phosphoric acid, acetic acid, and nitric acid with high etching selective ratio with respect to the oxide conductive layer and the oxide semiconductor layer including the superficial layer of the microcrystal group formed of nanocrystals. With the use of the mixed acid, it is possible that most of the microcrystal groups of nanocrystals in the superficial layer of the oxide semiconductor layer below the oxide conductive layer are left without being etched.

It is preferable that the heat treatment for the first oxide semiconductor layer and the second oxide semiconductor layer are performed with a rapid thermal annealing method.

According to one embodiment of the present invention, it is possible to manufacture a highly reliable transistor with favorable electrical characteristics and provide a highly reliable semiconductor device with high display quality.

BRIEF DESCRIPTION OF DRAWINGS

In the accompanying drawings:

FIGS. 1A to 1E are cross-sectional process views illustrating one embodiment of the present invention;

FIGS. 4A1 and 4A2 are plan views of a semiconductor device and FIG. 4B is a cross-sectional view of a semiconductor device;

FIG. 6A is a plan view of a semiconductor device and FIG. 6B is a cross-sectional view of a semiconductor device;

BEST MODE FOR CARRYING OUT THE INVENTION

Figure 2:
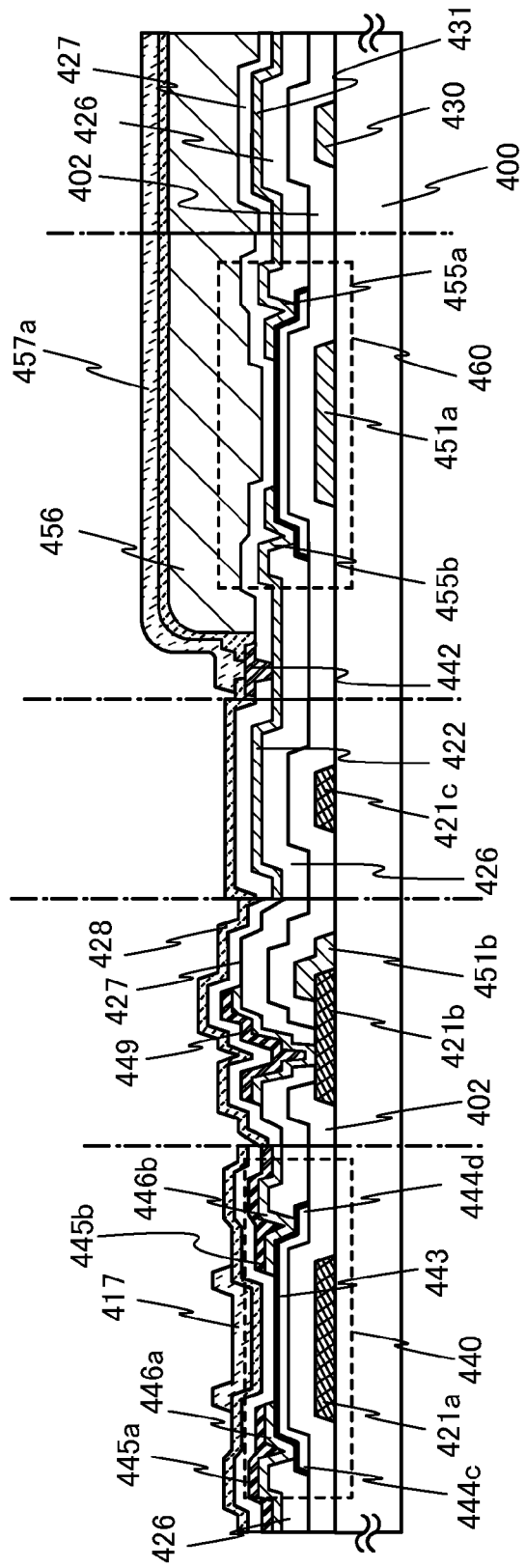
FIG. 2 is a cross-sectional view illustrating one embodiment of the present invention.

Hereinafter, embodiments of the present invention will be described in detail with reference to the accompanying drawings. However, the present invention is not limited to the description below, and it is easily understood by those skilled in the art that modes and details can be changed variously. In addition, the present invention is not construed as being limited to description of the embodiments. Note that in the drawings of this specification, the identical portions or portions having a similar function are denoted by the identical reference numerals, and description thereon may be omitted.

Embodiment 1

In this embodiment, a semiconductor device and a manufacturing method of the semiconductor device each of which is an embodiment of the present invention will be described.

FIG. 1E illustrates a cross-sectional structure of two transistors having different structures manufactured over one substrate. Transistors 440 and 460 have a kind of bottom-gate structure called an inverted staggered type.

The transistor 460 provided in a pixel includes a gate electrode layer 451a, a gate insulating layer 402, an oxide semiconductor layer 405, a source electrode layer 455a, and a drain electrode layer 455b over a substrate 400 having an insulating surface. In addition, an oxide insulating layer 426 is provided so as to cover the transistor 460 and be in contact with a side surface of the oxide semiconductor layer 405, and an oxide insulating layer 427 is provided so as to cover the transistor 460 and be in contact with a top surface of the oxide semiconductor layer 405. Note that the oxide insulating layer 426 is not necessarily provided.

Although the transistor 460 provided in the pixel is described using a single-gate transistor as an example, the transistor 460 may be a multi-gate transistor including a plurality of channel formation regions.

In the transistor 460, the gate insulating layer 402 and the oxide semiconductor layer 405 overlap with the gate electrode layer 451a, and the source electrode layer 455a and the drain electrode layer 455b partly overlapping with the oxide semiconductor layer 405 are formed. A channel formation region of the transistor 460 is a region of the oxide semiconductor layer 405 between a side surface of the source electrode layer 455a and a side surface of the drain electrode layer 455b which face each other, that is, a region of the oxide semiconductor layer 405 which is in contact with the gate insulating layer 402 and overlaps with the gate electrode layer 451a.

In order to realize a semiconductor device with a high aperture ratio, the gate electrode layer 451a, the source electrode layer 455a, and the drain electrode layer 455b in the transistor 460 are formed of a light-transmitting conductive film.

As a material of the light-transmitting conductive film, a conductive material that transmits visible light, for example, an In—Sn—O-based oxide conductive material, an In—Sn—Zn—O-based oxide conductive material, an In—Al—Zn—O-based oxide conductive material, an Sn—Ga—Zn—O-based oxide conductive material, an Al—Ga—Zn—O-based oxide conductive material, an Sn—Al—Zn—O-based oxide conductive material, an In—Zn—O-based oxide conductive material, an Sn—Zn—O-based oxide conductive material, an Al—Zn—O-based oxide conductive material, an In—O-based oxide conductive material, an Sn—O-based oxide conductive material, or a Zn—O-based oxide conductive material can be employed. Note that in the case of using a sputtering method for forming the light-transmitting conductive film, deposition may be performed with a target including silicon oxide at a concentration of greater than or equal to 2 wt % and less than or equal to 10 wt % so that $SiO_x$ (X>0) is included in the light-transmitting conductive film so as to be amorphous.

The transistor 440 provided in the driver circuit portion includes a gate electrode layer 421a, the gate insulating layer 402, an oxide semiconductor layer 404, oxide conductive layers 446a and 446b, a source electrode layer 445a, and a drain electrode layer 445b over the substrate 400 having an insulating surface. Further, the insulating layer 427 and a protective insulating layer 428 are provided over a channel formation region 443, the source electrode layer 445a, and the drain electrode layer 445b.

The gate electrode layer 421a, the source electrode layer 445a, and the drain electrode layer 445b of the transistor 440 can be a single film containing an element selected from Ti, Mo, W, Al, Cr, Cu, and Ta as a main component, an alloy film containing any of these elements, or a stacked layer film including any of the films. Further, the oxide conductive layers 446a and 446b are formed between the source electrode layer 445a and the oxide semiconductor layer 404 and between the drain electrode layer 445b and the oxide semiconductor layer 404, respectively. With this structure, the contact resistance can be reduced, which leads to a transistor capable of high-speed operation. Note that the oxide conductive layers 446a and 446b are formed using the same material as the source electrode layer 455a and the drain electrode layer 455b in the transistor 460.

A first region 444c and a second region 444d of the oxide semiconductor layer 404, which overlap with the oxide insulating layer 426, are in an oxygen-excess state like the channel formation region 443; thus, the leak current can be reduced and the parasitic capacitance can be reduced.

As a material of the oxide semiconductor layers 404 and 405, any of the following oxide semiconductors can be used: a four-component metal oxide semiconductor such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; or a two-component metal oxide such as an In—Zn—O-based metal oxide, a Sn—Zn—O-based metal oxide, an Al—Zn—O-based metal oxide, a Zn—Mg—O-based, a Sn—Mg—O-based metal oxide, or an In—Mg—O-based metal oxide; an In—O-based metal oxide, a Sn—O-based metal oxide, or a Zn—O-based metal oxide can be used. The above oxide semiconductors may include silicon oxide.

Note that as the oxide semiconductor layers 404 and 405, a thin film expressed by $InMO_3(ZnO)_m$ (m>0) can be used. Here, M represents one or more metal elements selected from Ga, Al, Mn, and Co. For example, M represents Ga, Ga and Al, Ga and Mn, Ga and Co, or the like. Among the oxide semiconductor films expressed by $InMO_3(ZnO)_m$ (m>0), an oxide semiconductor film which includes Ga as M is referred to as an In—Ga—Zn—O oxide semiconductor film as described above, and a thin film of the In—Ga—Zn—O oxide semiconductor is also referred to as an In—Ga—Zn—O film.

Each of the oxide semiconductor layers 404 and 405 is subjected to dehydration or dehydrogenation with a rapid thermal annealing (RTA) method or the like at high temperature for a short time. Dehydration or dehydrogenation can be performed using resistance heating, lamp irradiation, or the like in an inert gas atmosphere, by heat treatment at a temperature higher than or equal to 500° C. and lower than or equal to 750° C. (or a temperature lower than or equal to the strain point of a glass substrate) for approximately one minute to ten minutes, preferably at 650° C. for approximately three minutes to six minutes. With an RTA method, dehydration or dehydrogenation can be performed in a short time; therefore, treatment can be performed even at a temperature higher than the strain point of a glass substrate.

The oxide semiconductor layers 404 and 405 are amorphous layers having many dangling bonds at the stage where the oxide semiconductor layers 404 and 405 are in an as-depo state. Through the heating step for the dehydration or dehydrogenation, dangling bonds within a short distance are bonded to each other, so that the oxide semiconductor layers 404 and 405 can have an ordered amorphous structure. As ordering proceeds, the oxide semiconductor layers 404 and 405 come to be formed of a mixture of a amorphous oxide semiconductor and a microcrystalline oxide semiconductor, where an amorphous region is dotted with microcrystals, or be formed of a microcrystal group. Here, a microcrystal is a so-called nanocrystal with a particle size of greater than or equal to 1 nm and less than or equal to 20 nm, which is smaller than that of a microcrystalline particle generally called a microcrystal.

In the superficial portion of each of the oxide semiconductor layers 404 and 405, which is a crystallized region through the heating step, a nano-sized microcrystal which is c-axis-oriented in a direction perpendicular to a surface of the layer is formed. In that case, the long axis of the crystal is in the c-axis direction and the size in the short-axis direction is greater than or equal to 1 nm and less than or equal to 20 nm.

Therefore, in the superficial portions of the oxide semiconductor layers 404 and 405, dense crystal regions including microcrystal groups 404a and 405a including nanocrystals exist, and thus, degradation of electric characteristics due to a change to an n-type, which is attributed to entry of moisture or elimination of oxygen through the superficial portion, can be prevented. Further, since the superficial portions of the oxide semiconductor layers 404 and 405 are on the back channel side, preventing the oxide semiconductor layers 404 and 405 from being changed to an n-type is also effective for suppression of generation of a parasitic channel. Furthermore, contact resistance between the superficial portions where conductivity is increased owing to the crystal region and the source electrode layers 445a and 455a or the drain electrode layers 445b and 455b can be reduced.

Here, a crystal structure of an In—Ga—Zn—O film, which is readily obtained by the crystal growth, depends on a metal oxide target. For example, in the case where an In—Ga—Zn—O film is formed using a metal oxide target, which contains In, Ga, and Zn at a molar ratio of $In_2O_3:Ga_2O_3:ZnO=1:1:1$, and crystallization is performed through a heating step, a region between In oxide layers tends to grow layered compound crystal structure belonging to a hexagonal system in which one oxide layer or two oxide layers containing Ga and Zn coexists. Alternatively, in the case where a target whose molar ratio of $In_2O_3$ to $Ga_2O_3$ to ZnO is 1:1:2 is used for deposition, and crystallization is performed through a heating step, an oxide layer containing Ga and Zn between In oxide layers readily forms a two-layer structure. Since the crystal structure of the oxide layer containing Ga and Zn of the latter having a two-layer structure is stable and crystal growth readily occurs. In the case where a target whose molar ratio of $In_2O_3$ to $Ga_2O_3$ to ZnO is 1:1:2 is used for deposition, and crystallization is performed through a heating step, a crystal continuous from an outer layer of the oxide layer containing Ga and Zn to an interface between a gate insulating film and the oxide layer containing Ga and Zn is formed in some cases. Note that the molar ratio may be referred to as the ratio of number of atoms in the oxide layer.

Note that a crystal region is not formed in a side surface portion of the oxide semiconductor layer depending on the order of steps, and thus, the crystal region is formed only in an upper layer portion. However, the area of the side surface portion is small; therefore the above effect such as the effect to the degradation of electric characteristics and the generation of a parasitic channel can also be kept in that case.

The process for manufacturing the transistors 440 and 460 over one substrate will be described with reference to FIGS. 1A to 1E below.

First, after a conductive film is formed over the substrate 400 having an insulating surface, the gate electrode layers 421a and 421b are formed by a first photolithography step and an etching step.

Note that a resist mask may be formed by an inkjet method. Formation of the resist mask by an inkjet method needs no photomask; thus, manufacturing cost can be reduced. Needless to say, an inkjet method can be applied not only to the first photolithography step but also to another photolithography step.

As a conductive film for forming each of the gate electrode layers 421a and 421b, a single film containing an element selected from Ti, Mo, W, Al, Cr, Cu, and Ta as a main component, an alloy film containing any of these elements, a stacked layer film including any of the films, or the like can be employed.

As the substrate 400, a glass substrate whose strain point is 730° C. or more is preferably used when the temperature of the heat treatment performed later is high. As a glass substrate, a glass material such as aluminosilicate glass, aluminoborosilicate glass, or barium borosilicate glass is used, for example. Note that generally by containing a larger amount of barium oxide (BaO) than boric oxide, more-practical heat resistant glass can be obtained. Therefore, a glass substrate containing BaO and $B_2O_3$ in which the amount of BaO is larger than that of $B_2O_3$ is preferably used.

Note that instead of the above glass substrate, a substrate formed of an insulator such as a ceramic substrate, a quartz substrate, or a sapphire substrate may be used. Alternatively, crystallized glass or the like may be used.

An insulating layer serving as a base film may be provided between the substrate 400 and the gate electrode layers 421a and 421b. The base film has a function of preventing diffusion of an impurity element from the substrate 400, and can be formed to have a single-layer or stacked layer structure using one or more of a silicon nitride film, a silicon oxide film, a silicon nitride oxide film, and a silicon oxynitride film.

Next, a light-transmitting oxide conductive layer is formed so as to cover the gate electrode layers 421a and 421b, and then the gate electrode layers 451a and 451b are formed by a second photolithography step and an etching step. In this embodiment, in order to reduce the wiring resistance, a gate wiring provided in the pixel portion is formed using the same metal film as the gate electrode layer 421b.

As a material of the light-transmitting oxide conductive layer, a conductive material that transmits visible light, for example, an In—Sn—O-based oxide conductive material, an In—Sn—Zn—O-based oxide conductive material, an In—Al—Zn—O-based oxide conductive material, an Sn—Ga—Zn—O-based oxide conductive material, an Al—Ga—Zn—O-based oxide conductive material, an Sn—Al—Zn—O-based oxide conductive material, an In—Zn—O-based oxide conductive material, an Sn—Zn—O-based oxide conductive material, an Al—Zn—O-based oxide conductive material, an In—O-based oxide conductive material, an Sn—O-based oxide conductive material, or a Zn—O-based oxide conductive material can be employed. In the case of using a sputtering method, deposition may be performed with a target including silicon oxide at greater than or equal to 2 wt % and less than or equal to 10 wt % so that $SiO_x$ (X>0) may be included in the light-transmitting conductive film so as to be amorphous. In this embodiment, indium tin oxide containing silicon oxide is used.

Next, the gate insulating layer 402 is formed over the gate electrode layers 421a, 421b, 451a, and 451b.

In this embodiment, the gate insulating layer 402 is formed using a high-density plasma apparatus. Here, the high-density plasma apparatus refers to an apparatus which can realize a plasma density of $1 \times 10^{11}/cm^3$ or higher. For example, plasma is generated by applying a microwave power higher than or equal to 3 kW and lower than or equal to 6 kW so that an insulating film is formed.

A monosilane gas ($SiH_4$), nitrous oxide ($N_2O$), and a rare gas are introduced into a chamber as a source gas, and high-density plasma is generated at a pressure higher than or equal to 10 Pa and lower than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure of the substrate to the air, so that plasma treatment may be performed on a surface of the insulating film. The insulating film formed through the above procedure contributes to the formation of a semiconductor device with high reliability even if it has a thickness as small as 100 nm or less.

In forming the gate insulating layer 402, the flow ratio of a monosilane gas ($SiH_4$) to nitrous oxide ($N_2O$) which are introduced into the chamber is in the range of 1:10 to 1:200. As a rare gas which is introduced into the chamber, helium, argon, krypton, xenon, or the like can be used. In particular, argon, which is inexpensive, is preferably used.

Since the insulating film formed by using the high-density plasma apparatus has a uniform thickness, the insulating film has excellent ability to cover unevenness of a surface. Further, the use of the high-density plasma apparatus allows the thickness of the insulating film to be controlled precisely.

Unlike the insulating film formed by using a conventional parallel-plate PCVD apparatus in many points, the insulating film formed through the above process procedure has an etching rate which is lower than that of the insulating film formed by using the conventional parallel-plate PCVD apparatus by 10% or more or 20% or more in the case where the etching rates with the same etchant are compared to each other. Thus, it can be said that the insulating film obtained by the high-density plasma apparatus is a dense film.

In this embodiment, a silicon oxynitride film (also referred to as $SiO_xN_y$, where x>y>0) with a thickness of 100 nm formed using the high-density plasma apparatus is used as the gate insulating layer 402.

As another method, the gate insulating layer 402 can be formed by a plasma CVD method, a sputtering method, or the like. In that case, the gate insulating layer 402 can be formed to have a single-layer structure of a silicon oxide layer, a silicon nitride layer, a silicon oxynitride layer, or a silicon nitride oxide layer or a stacked layer structure thereof. For example, a silicon oxynitride layer may be formed by a plasma CVD method using $SiH_4$, oxygen, and nitrogen as a deposition gas. The thickness of the gate insulating layer 402 is greater than or equal to 100 nm and less than or equal to 500 nm; in the case of the stacked layer, a second gate insulating layer having a thickness greater than or equal to 5 nm and less than or equal to 300 nm is stacked over a first gate insulating layer having a thickness greater than or equal to 50 nm and less than or equal to 200 nm, for example.

Next, a contact hole reaching the gate electrode layer 421b is formed in the gate insulating layer 402 by a third photolithography step and an etching step. Note that, an oxide semiconductor film may be deposited and etched, and after that a resist mask may be formed over the oxide semiconductor layer, and a contact hole reaching the gate electrode layer 421b may be formed. In that case, reverse sputtering is preferably performed to remove a resist residue or the like from surfaces of the oxide semiconductor layer and the gate insulating layer 402.

In this embodiment, the contact hole reaching the gate electrode layer 421b is formed by the third photolithography step and the etching step; therefore, it is preferable that heat treatment (at higher than or equal to 400° C. and lower than the strain point of the substrate) in an inert gas atmosphere (e.g., nitrogen, helium, neon, or argon) be performed after the formation of the contact hole so as to remove an impurity such as hydrogen or water contained in the gate insulating layer 402 and the oxide semiconductor film be then formed.

Next, over the gate insulating layer 402, an oxide semiconductor film 403 is formed to a thickness greater than or equal to 5 nm and less than or equal to 200 nm, preferably greater than or equal to 10 nm and less than or equal to 20 nm (see FIG. 1A).

As a material of the oxide semiconductor film 403, a four-component metal oxide such as an In—Sn—Ga—Zn—O-based metal oxide; a three-component metal oxide such as an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, or a Sn—Al—Zn—O-based metal oxide; or a two-component metal oxide such as an In—Zn—O-based metal oxide, a Sn—Zn—O-based metal oxide, an Al—Zn—O-based metal oxide, a Zn—Mg—O-based metal oxide, a Sn—Mg—O-based metal oxide, or an In—Mg—O-based metal oxide; an In—O-based metal oxide, a Sn—O-based metal oxide, or a Zn—O-based metal oxide can be used. The above oxide semiconductor film may include silicon oxide. The oxide semiconductor film 403 can be formed by a sputtering method in a rare gas (typically argon) atmosphere, an oxygen atmosphere, or an atmosphere including a rare gas (typically argon) and oxygen.

In this embodiment, the deposition is performed using a metal oxide target including In, Ga, and Zn (the ratio of $In_2O_3$ to $Ga_2O_3$ to ZnO is 1:1:1 or 1:1:2 in molar ratio) under the following conditions: the distance between the substrate and a target is 100 mm, the pressure is 0.6 Pa, the direct-current (DC) power supply is 0.5 kW, and the atmosphere is oxygen (the flow rate of oxygen is 100%). Note that it is preferable that a pulsed direct-current (DC) power supply be used because powder substances (also referred to as particles or dust) generated in deposition can be reduced and the film thickness can be uniform. In this embodiment, as the oxide semiconductor film 403, a 15-nm-thick In—Ga—Zn—O film is formed by a sputtering method using an In—Ga—Zn—O-based metal oxide target.

Examples of the sputtering method include an RF sputtering method in which a high-frequency power source is used as a sputtering power source, a DC sputtering method, and a pulsed DC sputtering method in which a bias is applied in a pulsed manner. An RF sputtering method is mainly used in the case of forming an insulating layer, and a DC sputtering method is mainly used in the case of forming a conductive layer.

In addition, there is also a multi-source sputtering apparatus in which a plurality of targets of different materials can be set. With the multi-source sputtering apparatus, films of different materials can be formed and stacked in the same chamber, or a film of plural kinds of materials can be formed by electric discharge at the same time in the same chamber.

In addition, there are a sputtering apparatus used for a magnetron sputtering in which a magnet system is provided inside the chamber, and a sputtering apparatus used for an ECR sputtering method in which plasma generated with the use of microwaves is used without using glow discharge.

Furthermore, there are also a reactive sputtering method in which a target substance and a sputtering gas are chemically reacted with each other during deposition to form a thin compound film thereof, and a bias sputtering method in which voltage is also applied to a substrate during deposition.

Note that before the oxide semiconductor film is formed by a sputtering method, dust on a surface of the gate insulating layer 402 is preferably removed by reverse sputtering in which an argon gas is introduced and plasma is generated. The reverse sputtering refers to a method in which an RF power source is used for application of voltage to a substrate side in an argon atmosphere so that ionized argon collides with the substrate to modify a surface. Note that nitrogen, helium, oxygen or the like may be used instead of argon.

Before the deposition of the oxide semiconductor film, heat treatment may be performed in an inert gas atmosphere (such as nitrogen, helium, neon, or argon) to remove impurities such as hydrogen and water contained in the gate insulating layer 402.

Then, the oxide semiconductor film 403 is processed into the island-shaped oxide semiconductor layers 404 and 405 by a fourth photolithography step and an etching step.

Next, the oxide semiconductor layers 404 and 405 are dehydrated or dehydrogenated. First heat treatment for the dehydration or dehydrogenation can be performed with the use of resistance heating method, lamp irradiation, or the like in an inert gas atmosphere at a temperature higher than or equal to 500° C. and lower than or equal to 750° C. (or a temperature lower than or equal to the strain point of a glass substrate) for longer than or equal to one minute and shorter than or equal to ten minutes, preferably at 650° C. for longer than or equal to three minutes and shorter than or equal to six minutes. With an RTA method, dehydration or dehydrogenation can be performed in a short time; therefore, treatment can be performed even at a temperature higher than the strain point of a glass substrate. Note that the timing of the first heat treatment is not limited to this timing, and the first heat treatment may be performed plural times, for example, before and after a photolithography process or a deposition step.

Note that in this specification, heat treatment of a oxide semiconductor layer in the atmosphere of an inert gas such as nitrogen or a rare gas is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

It is important that the dehydrated or dehydrogenated oxide semiconductor layer is not exposed to the air so that entry of water or hydrogen into the oxide semiconductor layer can be prevented. In a transistor using an oxide semiconductor layer which is obtained in such a manner that an oxide semiconductor layer is allowed to be an n-type (e.g., $n^-$-type or $n^+$-type) oxide semiconductor layer, i.e. a low-resistant oxide semiconductor layer, by dehydration or dehydrogenation and then the n-type oxide semiconductor layer is changed into an i-type oxide semiconductor layer so as to have high resistance, the threshold voltage of the transistor is positive voltage, so that the transistor shows so-called normally-off characteristics. It is preferable for a transistor used in a display device that the gate voltage be a positive threshold voltage which is as close to 0 V as possible. As for an active matrix display device, electric characteristics of a transistor included in a circuit are significant, and performance of the display device depends on the electric characteristics thereof. Among the electric characteristics of the transistor, the threshold voltage is particularly important. If the threshold voltage of the transistor is negative, the transistor is in the normally-on state; in other words, current flows between the source electrode and the drain electrode even when the gate voltage is 0 V. Therefore it is difficult to control the circuit including the transistor. Further, in some case, when the absolute value of the threshold voltage is higher even if the threshold voltage is positive, the driving voltage is inflated and the transistor cannot perform switching operation in some cases. In the case of an n-channel transistor, it is preferable that a channel be formed and drain current begin to flow after the positive voltage is applied as the gate voltage. A transistor in which a channel is not formed unless the driving voltage is unnecessarily high and a transistor in which a channel is formed and drain current flows even at a negative voltage are unsuitable for a transistor used in a circuit.

Cooling of the oxide semiconductor after the dehydration or dehydrogenation may be carried out in an atmosphere which is different from that in dehydration or dehydrogenation. For example, cooling can be performed by using the furnace in which dehydration or dehydrogenation is performed and by filling the furnace with a high-purity oxygen gas, a high-purity $N_2O$ gas, or dry air (having a dew point of −40° C. or lower, preferably −60° C. or lower) without exposure to the air.

Note that in the first heat treatment, it is preferable that water, hydrogen, and the like be not contained in nitrogen or a rare gas such as helium, neon, or argon. Here, it is preferable that the purity of nitrogen or a rare gas such as helium, neon, or argon which is introduced to the heat treatment apparatus be 6N (99.9999%) or more, more preferably 7N (99.99999%) or more.

In the case where the first heat treatment is performed in an atmosphere of an inert gas as described above, an oxide semiconductor layer is changed into an oxygen-deficient oxide semiconductor layer by the first heat treatment to be an n-type (e.g., $n^-$-type) oxide semiconductor layer, i.e. a low-resistant oxide semiconductor layer. Then, the oxide semiconductor layer is transformed in an oxygen-excess state by formation of an oxide insulating layer which is in contact with the oxide semiconductor layer so as to be a high-resistance oxide semiconductor layer, i.e. an i-type oxide semiconductor layer. Accordingly, it is possible to form a highly reliable transistor having favorable electrical characteristics.

According to analysis with thermal desorption spectroscopy (TDS) an oxide semiconductor layer which is not subjected to the first heat treatment, two peaks which show discharge of moisture are detected up to 450° C. in the spectrum. On the other hand, in the oxide semiconductor layer which is sufficiently dehydrated or dehydrogenated under the above conditions, at least one peak at 250° C. to 300° C. of the two peaks is not detected.

In this embodiment, the substrate is introduced into a rapid thermal annealing (RTA) apparatus, and heat treatment for six minutes at 650° C. is performed to the oxide semiconductor layers 404 and 405 in a nitrogen atmosphere. At this time, not only the oxide semiconductor layers 404 and 405 are subjected to dehydration or dehydrogenation, but also superficial layers of the oxide semiconductor layers 404 and 405 are crystallized, so that microcrystal groups 404a and 405a including nanocrystals are formed (see FIG. 1B).

The oxide semiconductor layer after the first heat treatment exists in an oxygen-deficient oxide semiconductor layer, and the carrier concentration is higher than that just after being deposited, so that the oxide semiconductor layers 404 and 405 have lower resistance with a carrier concentration of $1 \times 10^{18}/cm^3$ or more. Depending on conditions of the first heat treatment and materials of the oxide semiconductor layers, the entire film may be crystallized to be microcrystalline or polycrystalline.

Further, depending on conditions of the first heat treatment and materials, the gate electrode layers 451a and 451b may also be crystallized to be microcrystalline or polycrystalline. For example, in the case where an indium tin oxide is used as the gate electrode layers 451a and 451b, they are crystallized by the first heat treatment at 450° C. for one hour, whereas in the case where an indium tin oxide containing a silicon oxide is used as the gate electrode layers 451a and 451b, they are not easily crystallized.

The first heat treatment for the oxide semiconductor layer can be performed before the oxide semiconductor film 403 is processed into the island-shaped oxide semiconductor layers.

Next, an oxide insulating layer is formed over the gate insulating layer 402 and the oxide semiconductor layers 404 and 405 by a sputtering method. Then, a resist mask is formed by a fifth photolithography step, and selective etching is performed thereon to form an oxide insulating layer 426. After that, the resist mask is removed. At this stage, the periphery and side surface of the oxide semiconductor layers 404 and 405 are covered with the oxide insulating layer 426. Note that the oxide insulating layer 426 is not necessarily provided. Next, a contact hole reaching the gate electrode layer 421b is formed by the fifth photolithography step and the etching step.

The oxide insulating layer 426 can be formed to have a thickness at least 1 nm by a method as appropriate in which an impurity such as water or hydrogen does not enter the oxide insulating layer. In this embodiment, a silicon oxide film is deposited as the oxide insulating layer 426 by a sputtering method. The substrate temperature in the deposition may be higher than or equal to room temperature and lower than or equal to 300° C. In this embodiment, the substrate temperature in the deposition is 100° C. In order to prevent entry of an impurity such as water or hydrogen in the deposition, it is preferable to perform pre-baking under reduced pressure at a temperature greater than or equal to 150° C. and less than or equal to 350° C. for longer than or equal to two minutes and shorter than or equal to ten minutes before deposition without exposing the substrate to the air. The deposition of the silicon oxide film by a sputtering method can be performed in a rare gas (typically argon) atmosphere, an oxygen atmosphere, or a mixed atmosphere containing a rare gas (typically argon) and oxygen. As a target for the deposition, a silicon oxide target or a silicon target can be used. For example, with use of a silicon target, a silicon oxide film can be formed by a sputtering method in an atmosphere of oxygen and a rare gas. As the oxide insulating layer 426 which is formed in contact with the oxide semiconductor layers 404 and 405 whose resistance is reduced, an inorganic insulating film which does not include impurities such as moisture, a hydrogen ion, and OW and blocks entry of these impurities from the outside is used. Specifically, a silicon oxide film, a silicon nitride oxide film, an aluminum oxide film, an aluminum oxynitride film, or the like is used.

In this embodiment, the deposition is performed by a pulsed DC sputtering method using a columnar polycrystalline, boron-doped silicon target which has a purity of 6N (the resistance is 0.01 Ωcm), in which the distance between the substrate and the target (T-S distance) is 89 mm, the pressure is 0.4 Pa, the direct-current (DC) power source is 6 kW, and the atmosphere is oxygen (the oxygen flow rate is 100%). The film thickness thereof is 300 nm.

Next, an oxide conductive layer and a metal layer are stacked over the gate insulating layer 402, the oxide insulating layer 426, and the oxide semiconductor layers 404 and 405. By using a sputtering method, the deposition of the stacked layer of the oxide conductive layer and the metal layer can be performed continuously without exposure to air (see FIG. 1C).

As the oxide conductive layer, a conductive material which has light-transmitting property to visible light and is applied to the gate electrode layers 451a and 451b described above is preferably used. In this embodiment, an indium tin oxide containing silicon oxide is used.

As a material of the metal film, an element selected from Ti, Mo, W, Al, Cr, Cu, and Ta, an alloy containing any of the above elements as a component, an alloy containing these elements in combination, or the like is used. The meal layer is not limited to a single layer containing any of the above elements, and can have a stacked structure of two or more layers. The metal film can be formed by a vacuum evaporation method (such as an electron beam evaporation method), an arc discharge ion plating method, a spray method, or the like, in addition to the aforementioned spattering method. In this embodiment, a titanium film formed by a sputtering method is used.

Next, a resist mask is formed by a sixth photolithography step, and the metal film is selectively etched, resulting in the source electrode layer 445a, the drain electrode layer 445b, which are provided in a driver circuit portion, and a connection electrode layer 449 of the transistor. After that, the resist mask is removed. At this time, the metal film over the transistor 460 in a pixel portion is removed by etching.

Next, a resist mask is formed by a seventh photolithography step, and the oxide conductive layer is selectively etched, resulting in the oxide conductive layer 446a overlapping with the source electrode layer 445a of the transistor 440 provided in the driver circuit portion, the oxide conductive layer 446b overlapping with the drain electrode layer 445b of the transistor 440 provided in the driver circuit portion, the source electrode layer 455a provided in the pixel portion, the drain electrode layer 455b provided in the pixel portion, and the connection electrode layers 448 and 449. After that, the resist mask is removed (see FIG. 1D).

Here, a mixed acid containing phosphoric acid, acetic acid, and nitric acid is used for etching of the oxide conductive layer. For example, a mixed acid containing phosphoric acid at 72.3%, acetic acid at 9.8%, nitric acid at 2.0%, and water at 15.9% can be used. Since the compositions of the oxide conductive layer and the oxide semiconductor layer are similar to each other, etching selective ratio is low in many cases. However, the oxide conductive layer in this embodiment (indium tin oxide containing silicon oxide) is amorphous and a microcrystal group of nanocrystals is formed in the superficial of the oxide semiconductor layers (In—Ga—Zn—O film) 404 and 405, so that relatively high etching ratio can be obtained. In the case of using the mixed acid, etching rate of the oxide conductive layer was 18.6 nm/sec, whereas etching rate of the oxide semiconductor layer in which a microcrystal group of nanocrystals is formed was 4.0 nm/sec. Therefore, the oxide conductive layer is etched using the mixed acid by controlling the etching time, whereby it is possible that most of the microcrystal groups of nanocrystals in the superficial layer of the oxide semiconductor layers 404 and 405 are left without being etched.

By providing the oxide conductive layers 446a and 446b between the oxide semiconductor layer 404 and each of the source electrode layer 445a and the drain electrode layer 445b, contact resistance can be decreased, so that a transistor capable of high-speed operation can be realized. In this embodiment, the oxide conductive layer 446a which is provided between the source electrode layer 445a and the oxide semiconductor layer 404 of the transistor 440 provided in the driver circuit portion functions as a source region, and the oxide conductive layer 446b which is provided between the drain electrode layer 445b and the oxide semiconductor layer 404 functions as a drain region. The oxide conductive layer 446a and 446b are effective in improving the frequency characteristics of a peripheral circuit (a drive circuit), for example.

On the other hand, the source electrode layer 455a and the drain electrode layer 455b of the transistor 460 provided in the pixel portion are formed using a light-transmitting oxide conductive layer, so that light can be transmitted; thus, the aperture ratio of each pixel can be improved.

Next, the insulating layer 427 is formed over the oxide insulating layer 426, the source electrode layer 455a and the drain electrode layer 455b of the transistor 460 provided in the pixel portion, the source electrode layer 445a and the drain electrode layer 445b of the transistor 440 provided in the driver circuit portion, and the connection electrode layer 449 (see FIG. 1E). As the insulating layer 427, a silicon oxide film, a silicon nitride oxide film, an aluminum oxide film, an aluminum oxynitride film, or the like can be used like the oxide insulating layer 426 described above. In this embodiment, a silicon oxide film formed by an RF sputtering method is used as the insulating layer 427.

Next, second heat treatment is performed at a temperature greater than or equal to 200° C. and less than or equal to 400° C., preferably greater than or equal to 250° C. and less than or equal to 350° C. in an atmosphere of an inert gas such as a nitrogen gas. For example, the heat treatment is performed at 250° C. in a nitrogen atmosphere for one hour. Alternatively, RTA treatment may be performed at high temperature for a short time as in the first heat treatment.

In the second heat treatment, part of the insulating layer 427 which is an oxide and the oxide semiconductor layers 404 and 405 are heated in contact with each other. Therefore, the oxide semiconductor layers 404 and 405 the resistance of which is reduced through the first heat treatment is supplied with oxygen from the insulating layer 427 to allow the oxide semiconductor layers 404 and 405 to exist in an oxygen-excess state, whereby the oxide semiconductor layers 404 and 405 have high resistance (i-type).

Although the second heat treatment is performed after the deposition of the insulating layer 427 in this embodiment, the present invention is not limited to this timing. The second heat treatment may be performed at any time after the deposition of the insulating layer 427. In addition, the second heat treatment may be performed plural times.

Next, a resist mask is formed by an eighth photolithography step, a contact hole reaching the drain electrode layer 455b in the insulating layer 427 is formed, and a connection electrode layer 442 which is connected to a pixel electrode layer in a later step is formed. The connection electrode layer 442 may be formed of a single film including an element selected from Al, Cr, Cu, Ta, Ti, Mo, and W as its main component, an alloy film containing any of these elements, a stacked layer film including any of the films, or the like can be employed. Note that in the case where the drain electrode layer 455b and the pixel electrode layer are directly connected, the connection electrode layer 442 may be omitted.

Then, the protective insulating layer 428 is formed over the insulating layer 427 (see FIG. 1E). The protective insulating layer 428 is formed of a silicon nitride film, a silicon nitride oxide film, an aluminum nitride film, or the like. In this embodiment, a silicon nitride film is formed as the protective insulating layer 428 by an RF sputtering method.

Although not illustrated, a planarization insulating layer may be provided between the insulating layer 427 and the protective insulating layer 428 in the pixel portion. The planarization insulating layer can be formed using an organic material having heat resistance, such as an acrylic resin, a polyimide, a benzocyclobutene-based resin, a polyamide, or an epoxy resin. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed using these materials. In addition, a color filter layer may be used as a planarization insulating layer.

Through the above, in this embodiment, a method for manufacturing a semiconductor device including a driver circuit portion which is capable of high-speed operation and a pixel portion with improved aperture ratio over one substrate can be provided.

Note that this embodiment can be freely combined with any of the other embodiments.

Embodiment 2

In this embodiment, an example in which an active matrix liquid crystal display device and light-emitting device are each manufactured by using the transistor described in Embodiment 1 and a pixel portion and a driver circuit are formed over one substrate will be described.

FIG. 2 illustrates an example of a cross-sectional structure of a liquid crystal display device as an active matrix substrate.

In this embodiment, a structure in which a driver circuit portion and a pixel portion are provided over one substrate is described by illustrating: a transistor 440 for the driver circuit portion; a transistor 460 for the pixel portion; a gate wiring contact portion; a storage capacitor; a gate wiring, a source wiring, and an intersection thereof; a pixel electrode; and the like. The storage capacitor, the gate wiring, and the source wiring can be formed by the same manufacturing steps as those of the transistors in Embodiment 1 and can be manufactured without increase in the number of photomasks and the steps.

In FIG. 2, the transistor 440 is a transistor provided in the driver circuit portion, and the transistor 460 which is electrically connected to a pixel electrode layer 457*a* is a transistor provided in the pixel portion.

In this embodiment, the transistor 460 formed over a substrate 400 has the same structure as the transistor in Embodiment 1.

A capacitor wiring layer 430 which is formed using the same material in the same step as a gate electrode layer of the transistor 460 overlaps with a capacitor electrode layer 431 and with a gate insulating layer 402 serving as a dielectric therebetween; thus, a storage capacitor is formed. Note that the capacitor electrode layer 431 is formed using the same material in the same step as a source electrode layer 455*a* or a drain electrode layer 455*b* of the transistor 460.

Note that the storage capacitor is provided below the pixel electrode layer 457*a*, and the capacitor electrode layer 431 is electrically connected to the pixel electrode layer 457*a*.

Although the example in which the storage capacitor is formed using the capacitor electrode layer 431 and the capacitor wiring layer 430 is described in this embodiment, there is no particular limitation on the structure of the storage capacitor. For example, a gate wiring, a planarization insulating layer, a protective insulating layer, a gate insulating layer, and the pixel electrode layer 457*a* may overlap with each other to form the storage capacitor Further, plural gate wirings, source wirings, and capacitor wiring layers are provided in accordance with the pixel density. In a terminal portion, plural first terminal electrodes at the same potential as the gate wirings, plural second terminal electrodes at the same potential as the source wirings, plural third terminal electrodes at the same potential as the capacitor wiring layer, and the like are arranged. The number of each type of the terminal electrodes may be any number determined as appropriate by a practitioner.

In the gate wiring contact portion, a gate electrode layer 421*b* can be formed using a low-resistance metal material. The gate electrode layer 421*b* is electrically connected to the gate wiring through a contact hole reaching the gate wiring.

Heat treatment for dehydration or dehydrogenation of the oxide semiconductor layer may be performed after the oxide semiconductor layer is formed; after an oxide conductive layer is stacked over the oxide semiconductor layer; or after a passivation film is formed over the source electrode and the drain electrode.

The gate electrode layer 421*a* of the transistor 440 in the drive circuit portion may be electrically connected to a conductive layer 417 provided above the oxide semiconductor layer.

Further, in the wiring intersection portion, in order to reduce the parasitic capacitance, the gate insulating layer 402 and an oxide insulating layer 426 are stacked between a gate wiring layer 421*c* and a source wiring layer 422 as illustrated in FIG. 2.

When an active matrix liquid crystal display device is manufactured, an active matrix substrate and a counter substrate provided with a counter electrode are fixed to each other with a liquid crystal layer therebetween. Note that a common electrode electrically connected to the counter electrode provided for the counter substrate is provided over the active matrix substrate, and a fourth terminal electrode electrically connected to the common electrode is provided in the terminal portion. This fourth terminal electrode is a terminal for setting the common electrode at a fixed potential such as GND or 0 V. The fourth terminal electrode can be formed from the same light-transmitting material as the pixel electrode layer 457*a*.

When the same material is used for the gate electrode layers, the source electrode layers, the drain electrode layers, the pixel electrode layer, another electrode layers, and another wiring layers, a common raw material or a common manufacturing apparatus can be shared; thus, manufacturing costs can be reduced.

When a photosensitive resin material is used for a planarization insulating layer 456 in the structure of FIG. 2, the step for forming a resist mask can be omitted.

Figure 3:
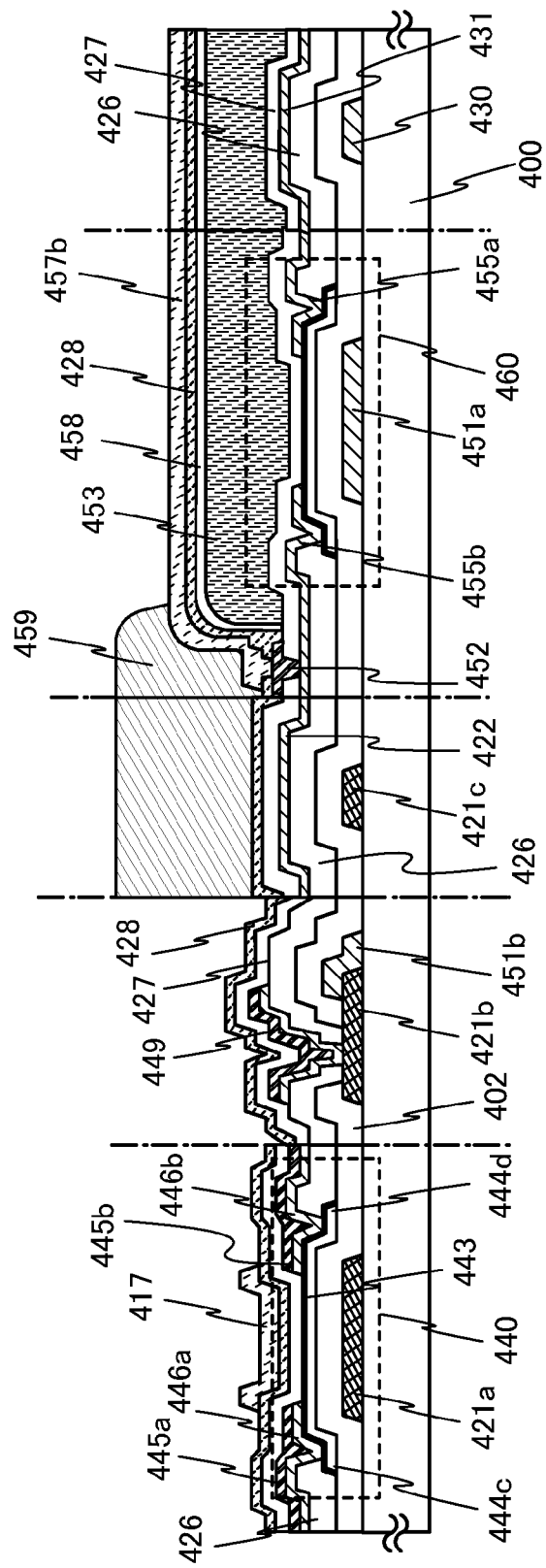
FIG. 3 is a cross-sectional view illustrating one embodiment of the present invention.

FIG. 3 illustrates a cross-sectional view in a state of a substrate before an EL layer is formed over a first electrode (a pixel electrode) as an active matrix light-emitting device.

In FIG. 3, an inverted staggered transistor is illustrated, and the transistor having a structure similar to that described in Embodiment 1 can be used. In addition, the active matrix light-emitting device illustrated in FIG. 3 can have a structure similar to that of the above liquid crystal display device except for the structure of the pixel portion which will be shown below.

As shown in FIG. 3, after an insulating layer 427 is formed, a color filter layer 453 is formed. The colors of the color filter layers are red, green, and blue. The color filter layers of red, green, and blue are sequentially formed by a printing method, an inkjet method, an etching method using a photolithography technique, or the like. By providing the color filter layer 453 on the substrate 400 side, alignment of the color filter layer 453 and a light-emitting region of a light-emitting element can be omitted.

Next, an overcoat layer 458 which covers the color filter layer 453 is formed. The overcoat layer 458 is formed using a light-transmitting resin.

Here, an example in which full-color display is performed using color filter layers of three colors of red, green, and blue is shown; however, the full-color display is not particularly limited thereto. Alternatively, full-color display may be performed by adding a color filter layer of cyan, magenta, yellow, or white to the color filter layers of three colors of red, green, and blue.

Next, a protective insulating layer 428 covering the overcoat layer 458 and the insulating layer 427 is formed. For the protective insulating layer 428, an inorganic insulating film such as a silicon nitride film, an aluminum nitride film, a silicon nitride oxide film, or an aluminum oxynitride film is used.

Next, the protective insulating layer 428 is selectively etched by a photolithography step, so that a contact hole reaching a connection electrode layer 452 is formed. In addition, by this photolithography step, the protective insulating layer 428 and the insulating layer 427 in a terminal portion are selectively etched to expose part of a terminal electrode. Further, in order to connect a second electrode of a light-emitting element formed later to a common potential line, a contact hole reaching the common potential line is also formed.

Next, a light-transmitting conductive film is formed, and a first electrode 457b which is electrically connected to the connection electrode layer 452 is formed by a photolithography step and an etching step.

Next, a partition wall 459 is formed to cover the periphery of the first electrode 457b. The partition wall 459 is formed using an organic resin film of a polyimide, an acrylic resin, a polyamide, an epoxy resin, or the like, an inorganic insulating film, or an organic polysiloxane. It is preferable that the partition wall 459 be formed to have an opening portion over the first electrode 457b so that a sidewall is formed as an inclined surface with curvature. Such an opening can be easily formed by forming the partition wall 459 using a photosensitive resin material.

Through the above process, the substrate in the state illustrated in FIG. 3 can be obtained. After the above process, an EL layer is formed over the first electrode 457b, and a second electrode is formed over the EL layer, so that a light-emitting element is formed. Note that the second electrode is electrically connected to the common potential line.

A conductive layer 417 may be provided over the oxide semiconductor layer in the transistor 440 of the driver circuit portion described in FIG. 3. The conductive layer 417 can be formed using the same material in the same step as the pixel electrode layer 457a or the first electrode 457b.

The conductive layer 417 is provided so as to overlap with a channel formation region 443 of the oxide semiconductor layer, whereby the amount of change in threshold voltage over time of the transistor 440 can be reduced. When the conductive layer 417 has a potential which is the same as that of the gate electrode layer 421a, the conductive layer 417 can function as a second gate electrode layer. In addition, the conductive layer 417 may have a potential which is different from that of the gate electrode layer 421a. Alternatively, the potential of the conductive layer 417 may be GND or 0 V, or the conductive layer 417 may be in a floating state.

Since a transistor is easily broken due to static electricity or the like, a protective circuit is preferably provided over the same substrate as the pixel portion and the driver circuit portion. The protective circuit is preferably formed with a non-linear element including an oxide semiconductor layer. For example, protective circuits are provided between the pixel portion and a scan line input terminal and between the pixel portion and a signal line input terminal. In this embodiment, a plurality of protective circuits are provided so as to prevent breakage of a pixel transistor and the like which can be caused when a surge voltage due to static electricity or the like is applied to a scan line, a signal line, and a capacitor bus line. Therefore, the protective circuit is formed so as to release charge to a common wiring when surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can be formed through the same process as the transistor 460 in the pixel portion, and can be made to have the same properties as a diode by connecting a gate terminal to a drain terminal of the non-linear element.

Note that in this embodiment, the same structure as the transistor in Embodiment 1 is used. The gate electrode layer 451a, the source electrode layer 455a, and the drain electrode layer 455b of the transistor 460 and the capacitor wiring layer 430 and the capacitor electrode layer 431 of the storage capacitor portion are formed using a light-transmitting oxide conductive layer. Therefore, the transistor 460 and the storage capacitor portion in the pixel portion have a light-transmitting property; thus the aperture ratio can be increased.

Note that this embodiment can be freely combined with any of the other embodiments.

Embodiment 3

A semiconductor device having a display function (also referred to as a display device) can be manufactured using the transistor described in Embodiment 1. Further, when a driver circuit portion and the pixel portion including transistors are formed over one substrate, a system-on-panel can be obtained.

A display device includes a display element. A display medium whose contrast is changed by an electric effect, such as a liquid crystal element (also referred to as a liquid crystal display element) or an electronic ink, can be employed in the display element.

Note that a display device in this specification means an image display device, a display device, or a light source (including a lighting device). In addition, the display device includes any of the following modules in its category: a module including a flexible printed circuit (FPC) or a tape automated bonding (TAB) tape; a module having TAB tape whose end is provided with a printed wiring board; and a module having an integrated circuit (IC) which is directly mounted on a display element by a chip on glass (COG) method.

The appearance and the cross section of a liquid crystal display panel, which is one embodiment of a semiconductor device, will be described with reference to FIGS. 4A1, 4A2 and 4B. FIGS. 4A1 and 4A2 are top views of a panel in which transistors 4010 and 4011 and a liquid crystal element 4013 are sealed between a first substrate 4001 and a second substrate 4006 with a sealant 4005. FIG. 4B is a cross-sectional view taken along line M-N of FIGS. 4A1 and 4A2.

The sealant 4005 is provided so as to surround a pixel portion 4002 and a scan line driver circuit portion 4004 which are provided over the first substrate 4001. The second substrate 4006 is provided over the pixel portion 4002 and the scan line driver circuit portion 4004. Therefore, the pixel portion 4002 and the scan line driver circuit 4004 are sealed together with a liquid crystal layer 4008 by the first substrate 4001, the sealant 4005, and the second substrate 4006. Further, a signal line driver circuit portion 4003 which is formed using a single crystal semiconductor or a polycrystalline semiconductor is mounted in a region different from the region surrounded by the sealant 4005 over the first substrate 4001.

Note that there is no particular limitation on the connection method of the signal line driver circuit portion 4003: a COG method, a wire bonding method, a TAB method, or the like can be used. FIG. 4A1 illustrates an example of mounting the signal line driver circuit portion 4003 by a COG method, and FIG. 4A2 illustrates an example of mounting the signal line driver circuit portion 4003 by a TAB method.

The pixel portion 4002 and the scan line driver circuit portion 4004 provided over the first substrate 4001 each include a plurality of transistors. FIG. 4B illustrates the transistor 4010 included in the pixel portion 4002 and the transistor 4011 included in the scan line driver circuit portion 4004, as an example. Insulating layers 4041, 4020, and 4021 are provided over the transistors 4010 and 4011.

The highly reliable transistor including the oxide semiconductor layer which is described in Embodiment 1 can be used as the transistors 4010 and 4011. In this embodiment, the transistors 4010 and 4011 are n-channel transistors.

A conductive layer 4040 is provided over part of the insulating layer 4021 so as to overlap with a channel formation region of the oxide semiconductor layer in the transistor portion 4011 for the driver circuit. The conductive layer 4040 is provided so as to overlap with the channel formation region of the oxide semiconductor layer, whereby the amount of change in the threshold voltage of the transistor 4011 can be reduced. In addition, a potential of the conductive layer 4040 may be the same as or different from that of a gate electrode layer of the transistor 4011. The conductive layer 4040 can also function as a second gate electrode layer. Alternatively, the potential of the conductive layer 4040 may be GND or 0 V, or the conductive layer 4040 may be in a floating state.

A pixel electrode 4030 included in the liquid crystal element 4013 is electrically connected to the transistor 4010. A counter electrode 4031 of the liquid crystal element 4013 is formed on the second substrate 4006. A portion where the pixel electrode 4030, the counter electrode 4031, and the liquid crystal layer 4008 overlap with each other corresponds to the liquid crystal element 4013. Note that the pixel electrode 4030 and the counter electrode 4031 are respectively provided with an insulating layer 4032 and an insulating layer 4033 each serving as an alignment film.

Note that a light-transmitting substrate can be used as the first substrate 4001 and the second substrate 4006; glass, ceramics, or plastics can be used. As plastic, a fiberglass-reinforced plastics (FRP) plate, a poly(vinyl fluoride) (PVF) film, a polyester film, or an acrylic resin film can be used.

A spacer 4035 which can be obtained by selective etching of an insulating layer is provided in order to control a distance (a cell gap) between the pixel electrode 4030 and the counter electrode 4031. Alternatively, a spherical spacer may be used. The counter electrode 4031 is electrically connected to a common potential line provided over the same substrate as the transistor 4010. With the use of a common connection portion, the counter electrode 4031 and the common potential line can be electrically connected to each other through conductive particles arranged between the pair of substrates. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more so as to improve the temperature range is used for the liquid crystal layer 4008. The liquid crystal composition which includes a liquid crystal showing a blue phase and a chiral agent has a short response time of 1 msec or less, has optical isotropy, which makes the alignment process unneeded, and has a small viewing angle dependence.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to that in this embodiment and may be set as appropriate depending on materials of the polarizing plate and the coloring layer or conditions of manufacturing process.

In the transistor 4011, the insulating layer 4041 is formed in contact with the semiconductor layer including the channel formation region. The insulating layer 4041 can be formed using a material and a method which are similar to those of the insulating layer 427 described in Embodiment 1. In order to reduce the surface roughness due to the transistors, the insulating layer 4041 is covered with the insulating layer 4021 which functions as a planarization insulating layer. Here, a silicon oxide film is formed by a sputtering method in a manner similar to that in Embodiment 1, as the insulating layer 4041.

Further, the protective insulating layer 4020 is formed over the insulating layer 4041. The protective insulating layer 4020 can be formed using a material and a method which are similar to those of the protective insulating layer 428 described in Embodiment 1. Here, a silicon nitride film is formed by a PCVD method, as the protective insulating layer 4020.

The insulating layer 4021 is formed as the planarization insulating layer. For the insulating layer 4021, an organic material having heat resistance, such as an acrylic resin, a polyimide, a benzocyclobutene-based resin, a polyamide, or an epoxy resin, can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating layers formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

A formation method of the insulating layer 4021 is not particularly limited, and the following method or tool can be employed depending on the material: a sputtering method, an SOG method, a spin coating method, a dipping method, a spray coating method, a droplet discharge method (e.g., an ink-jet method, screen printing, offset printing, or the like), a doctor knife, a roll coater, a curtain coater, a knife coater, or the like. The baking step of the insulating layer 4021 also serves as annealing of the oxide semiconductor layer, whereby a semiconductor device can be manufactured efficiently.

The pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

Alternatively, the pixel electrode 4030 and the counter electrode 4031 can be formed using a conductive composition containing a conductive macromolecule (also referred to as a conductive polymer). It is preferable that the pixel electrode formed using the conductive composition have a sheet resistance of 10,000 Ω/square or less and a light transmittance of 70% or more at a wavelength of 550 nm Further, the resistivity of the conductive macromolecule included in the conductive composition is preferably 0.1 Ω·cm or less.

As the conductive macromolecule, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

Further, a variety of signals and potentials are supplied to the signal line driver circuit portion 4003 which is formed separately, the scan line driver circuit portion 4004, and the pixel portion 4002 through an FPC 4018.

A connection terminal electrode 4015 is formed using the same conductive film as the pixel electrode 4030 included in the liquid crystal element 4013. A terminal electrode 4016 is formed using the same conductive film as source and drain electrode layers included in the transistors 4010 and 4011.

The connection terminal electrode 4015 is electrically connected to a terminal included in the FPC 4018 via an anisotropic conductive film 4019.

Note that FIGS. 4A1, 4A2 and 4B illustrate the example in which the signal line driver circuit portion 4003 is formed separately and mounted on the first substrate 4001; however, this embodiment is not limited to this structure. The signal line driver circuit portion 4003 may be formed over the first substrate 4001.

Figure 5:
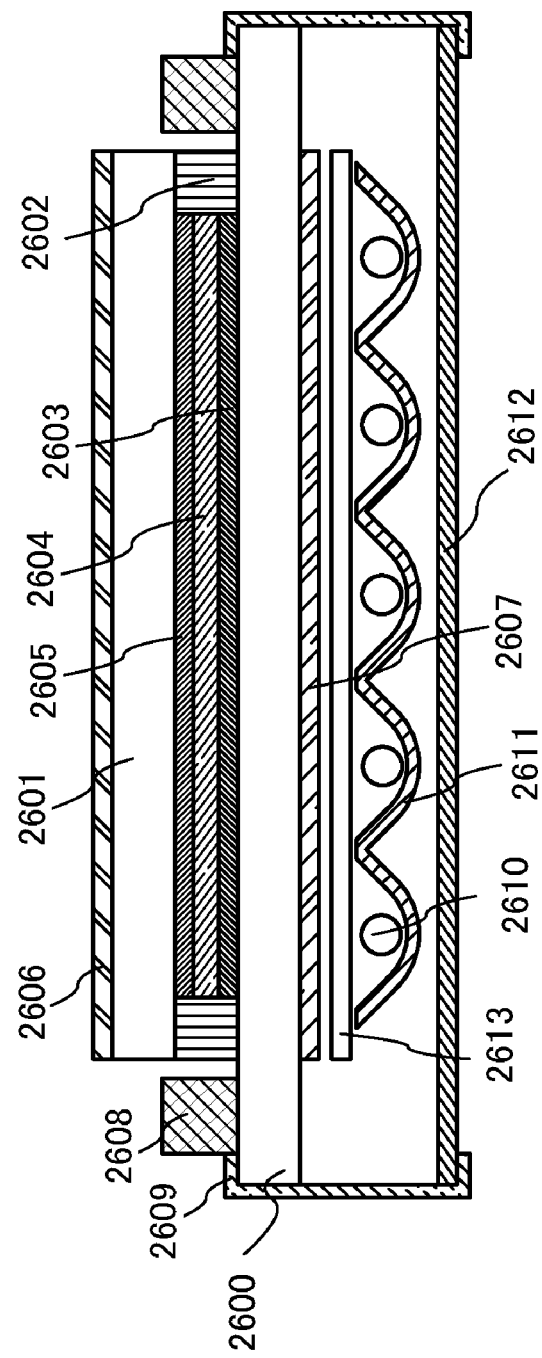
FIG. 5 is a cross-sectional view of a semiconductor device.

FIG. 5 illustrates an example of a liquid crystal display module by using a substrate including transistors which are manufactured according to a manufacturing method disclosed in this specification.

FIG. 5 illustrates an example of a liquid crystal display module, in which the substrate 2600 including transistors and a counter substrate 2601 are fixed to each other with a sealant 2602, and a pixel portion 2603 including a transistor or the like, a display element 2604 including a liquid crystal layer, a coloring layer 2605, and the like are provided. The coloring layer 2605 is necessary to perform color display. In the case of the RGB system, coloring layers corresponding to colors of red, green, and blue are provided for pixels. Polarizing plates 2606 and 2607 and a diffusion plate 2613 are provided outside the substrate 2600 and the counter substrate 2601 including transistors. A light source includes a cold cathode tube 2610 and a reflective plate 2611. A circuit substrate 2612 is connected to a wiring circuit portion 2608 of the substrate 2600 including transistors through a flexible wiring board 2609. The circuit substrate 2612 includes an external circuit such as a control circuit or a power source circuit. The polarizing plate and the liquid crystal layer may be stacked with a retardation plate therebetween.

The liquid crystal display module can employ a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optical compensated birefringence) mode, an FLC (ferroelectric liquid crystal) mode, an AFLC (anti ferroelectric liquid crystal) mode, or the like.

Through the above process, a highly reliable liquid crystal display panel as a semiconductor device can be manufactured.

Note that this embodiment can be freely combined with any of the other embodiments.

Embodiment 4

In this embodiment, the appearance and the cross section of a light-emitting display panel (also referred to as a light-emitting panel) will be described with reference to FIGS. 6A and 6B. FIGS. 6A and 6B are top views of a panel in which transistors and a light-emitting element, which are formed over a first substrate, are sealed between the first substrate and a second substrate with a sealant. FIG. 6B corresponds to a cross-sectional view taken along line H-I of FIG. 6A.

A sealant 4505 is provided so as to surround a pixel portion 4502, signal line driver circuit portions 4503a and 4503b, and scan line driver circuit portions 4504a and 4504b which are provided over a first substrate 4501. In addition, a second substrate 4506 is provided over the pixel portion 4502, the signal line driver circuit portions 4503a and 4503b, and the scan line driver circuit portions 4504a and 4504b.

Accordingly, the pixel portion 4502, the signal line driver circuit portions 4503a and 4503b, and the scan line driver circuit portions 4504a and 4504b are sealed together with a filler 4507, by the first substrate 4501, the sealant 4505, and the second substrate 4506. Furthermore, it is preferable that the display device be packaged (sealed) with a protective film (such as a bonding film or an ultraviolet curable resin film) or a cover material with high air-tightness and little degasification so that the display device is not exposed to the outside air.

The pixel portion 4502, the signal line driver circuit portions 4503a and 4503b, and the scan line driver circuit portions 4504a and 4504b formed over the first substrate 4501 each include a plurality of transistors, and a transistor 4510 included in the pixel portion 4502 and a transistor 4509 included in the signal line driver circuit portion 4503a are illustrated as an example in FIG. 6B.

For the transistors 4509 and 4510, the highly reliable transistor including the oxide semiconductor layer described in Embodiment 1 can be employed. In this embodiment, the transistors 4509 and 4510 are n-channel transistors.

A conductive layer 4540 is provided over part of an insulating layer 4544 so as to overlap with a channel formation region of the oxide semiconductor layer in the transistor 4509 for the driver circuit portions. The conductive layer 4540 is provided so as to overlap with the channel formation region of the oxide semiconductor layer, whereby the amount of change in the threshold voltage of the transistor 4509 can be reduced. A potential of the conductive layer 4540 is the same as that of a gate electrode layer of the transistor 4509, whereby the conductive layer 4540 can also function as a second gate electrode layer. The conductive layer 4540 may be given a potential different from that of a gate electrode layer of the transistor 4509. Alternatively, the potential of the conductive layer 4540 may be GND or 0 V, or the conductive layer 4540 may be in a floating state.

In the transistor 4509, an oxide insulating layer 4541 which covers a peripheral portion (including a side surface) of the oxide semiconductor layer is formed.

Further, the transistor 4510 is electrically connected to a first electrode 4517 through a connection electrode layer 4548. Further, an oxide insulating layer 4542 which covers a peripheral portion (including a side surface) of the oxide semiconductor layer of the transistor 4510 is formed.

The oxide insulating layers 4541 and 4542 each can be formed using a material and a method which are similar to those of the oxide insulating layer 426 described in Embodiment 1. Furthermore, the insulating layer 4544 is formed so as to cover the oxide insulating layers 4541 and 4542. The insulating layer 4544 may be formed using a material and a method similar to those of the protective insulating layer 428 described in Embodiment 1.

A color filter layer 4545 is formed over the transistor 4510 so as to overlap with a light emitting region of a light-emitting element 4511.

In order to reduce the surface roughness due to the color filter layer 4545, the color filter layer 4545 is covered with an overcoat layer 4543 which functions as a planarization insulating layer.

Further, an insulating layer 4546 is formed over the overcoat layer 4543. The insulating layer 4546 may be formed using a material and a method which are similar to those of the protective insulating layer 428 described in Embodiment 1.

In addition, the first electrode 4517 that is a pixel electrode included in the light-emitting element 4511 is electrically connected to a source electrode layer or a drain electrode layer of the transistor 4510. Note that the structure of the light-emitting element 4511 is not limited to a stacked structure of the first electrode 4517, an electroluminescent layer 4512, and a second electrode 4513. The structure of the light-emitting element 4511 can be changed as appropriate depending on the direction in which light is extracted from the light-emitting element 4511, or the like.

A partition wall 4520 is formed using an organic resin film, an inorganic insulating film, or organic polysiloxane. It is preferable that the partition wall 4520 be formed to have an opening over the first electrode 4517 so that a sidewall is formed as an inclined surface with curvature. Such an opening can be easily formed by forming the partition wall 4520 using a photosensitive resin material.

The electroluminescent layer 4512 may be formed with a single layer or a plurality of layers stacked.

A protective film may be formed over the second electrode 4513 and the partition wall 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

A variety of signals and potentials are supplied to the signal line driver circuit portions 4503*a* and 4503*b*, the scan line driver circuit portions 4504*a* and 4504*b*, or the pixel portion 4502 via FPCs 4518*a* and 4518*b*.

A connection terminal electrode 4515 is formed from the same conductive film as the first electrode 4517 included in the light-emitting element 4511, and a terminal electrode 4516 is formed from the same conductive film as the source and drain electrode layers included in the transistor 4509.

The connection terminal electrode 4515 is electrically connected to a terminal included in the FPC 4518*a* via an anisotropic conductive film 4519.

The first substrate located in the direction in which light is extracted from the light-emitting element 4511 needs to have a light-transmitting property. In that case, a light-transmitting material such as a glass plate, a plastic plate, a polyester film, or an acrylic film is used.

As the filler 4507, an ultraviolet curable resin or a thermosetting resin can be used, in addition to an inert gas such as nitrogen or argon. For example, PVC (poly(vinyl chloride)), an acrylic resin, a polyimide, an epoxy resin, a silicone resin, PVB (poly(vinyl butyral)), or EVA (a polymer of ethylene with vinyl acetate) can be used.

If necessary, an optical film such as a polarizing plate, a circularly polarizing plate (including an elliptically polarizing plate), a retardation plate (a quarter-wave plate or a half-wave plate) may be provided as appropriate for a light-emitting surface of the light-emitting element. Further, a polarizing plate or a circularly polarizing plate may be provided with an anti-reflection film. For example, anti-glare treatment by which reflected light can be diffused by the surface roughness so as to reduce the glare can be performed.

Part of the signal line driver circuit portions or part of the scan line driver circuit portions may be separately formed and mounted. This embodiment is not limited to the structure illustrated in FIGS. 6A and 6B.

Through the above steps, a highly reliable light-emitting display device (display panel) can be manufactured.

Note that this embodiment can be freely combined with any of the other embodiments.

Embodiment 5

Figure 7A:
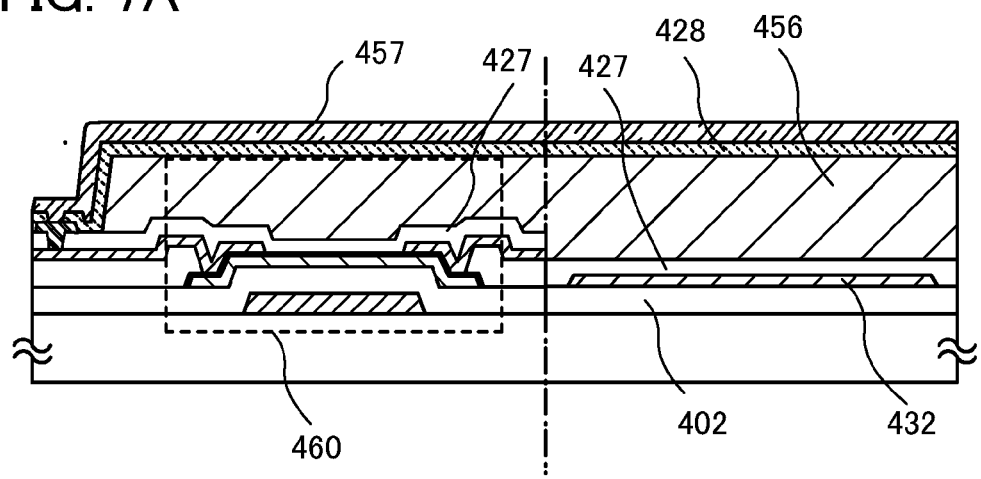
FIGS. 7A and 7B are cross-sectional views illustrating one embodiment of the present invention.

In this embodiment, an example of a structure of a storage capacitor, which is different from that of Embodiment 2, will be described with reference to FIGS. 7A and 7B. FIG. 7A is the same as FIG. 2 and FIG. 3 except for a structure of the storage capacitor; therefore, the same portions are denoted by the same reference numerals and detailed description of the same portion is omitted. Note that FIG. 7A illustrates a cross-sectional structure of a transistor 460 and the storage capacitor in the pixel portion.

FIG. 7A illustrates an example in which the storage capacitor is formed with the use of an insulating layer 427, a protective insulating layer 428, and a planarization insulating layer 456 as dielectrics, and with the use of a pixel electrode layer 457 and a storage wiring layer 432 which overlaps with the pixel electrode layer 457 as electrodes. The capacitor wiring layer 432 is formed using the same light-transmitting material and in the same step as the source electrode layer and the drain electrode layer of the transistor 460 in the pixel portion; therefore, the capacitor wiring layer 432 is disposed so as not to overlap with the source wiring layer of the transistor 460.

In the storage capacitor illustrated in FIG. 7A, the pair of electrodes and the dielectrics have a light-transmitting property, and thus the whole storage capacitor has a light-transmitting property.

Figure 7B:
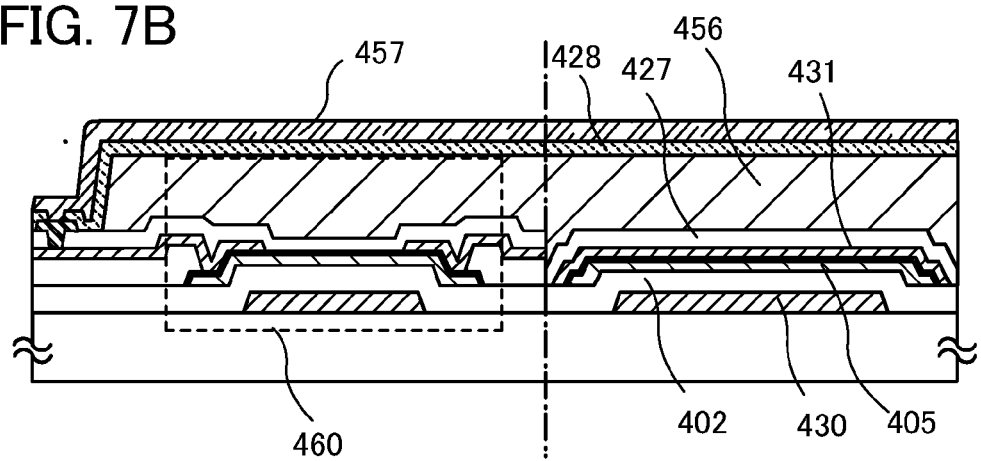

FIG. 7B illustrates an example of a storage capacitor having a structure different from that in FIG. 7A. FIG. 7B is the same as FIG. 2 and FIG. 3 except for a structure of the storage capacitor; therefore, the same portions are denoted by the same reference numerals and detailed description of the same portions are omitted.

FIG. 7B illustrates an example in which the storage capacitor is formed with the use of a capacitor wiring layer 430 and a stack of an oxide semiconductor layer 405 and a capacitor electrode layer 431 which overlap with the capacitor wiring layer 430 with a gate insulating layer 402 serving as dielectrics. The capacitor electrode layer 431 is stacked on and in contact with the oxide semiconductor layer 405 and functions as one electrode of the storage capacitor. Note that the capacitor electrode layer 431 is formed from the same light-transmitting material in the same step as the source electrode layer and the drain electrode layer of the transistor 460. In addition, since the capacitor wiring layer 430 is formed using the same light-transmitting material in the same step as the gate electrode layer of the transistor 460, the capacitor wiring layer 430 is arranged so as not to overlap with a gate wiring layer of the transistor 460.

Further, the capacitor electrode layer 431 is electrically connected to the pixel electrode layer 457.

Also in the storage capacitor illustrated in FIG. 7B, the pair of electrodes and the dielectrics have light-transmitting properties; thus, the storage capacitor as a whole has a light-transmitting property.

Each of the storage capacitors illustrated in FIGS. 7A and 7B has light-transmitting properties; thus, sufficient capacitance and high aperture ratio can be obtained even when the size of a pixel is decreased in order to realize higher definition of display images by increasing the number of gate wirings, for example.

Note that this embodiment can be freely combined with any of the other embodiments.

Embodiment 6

In this embodiment, an example of electronic paper is described as a semiconductor device to which the transistor described in Embodiment 1 is applied.

Figure 8:
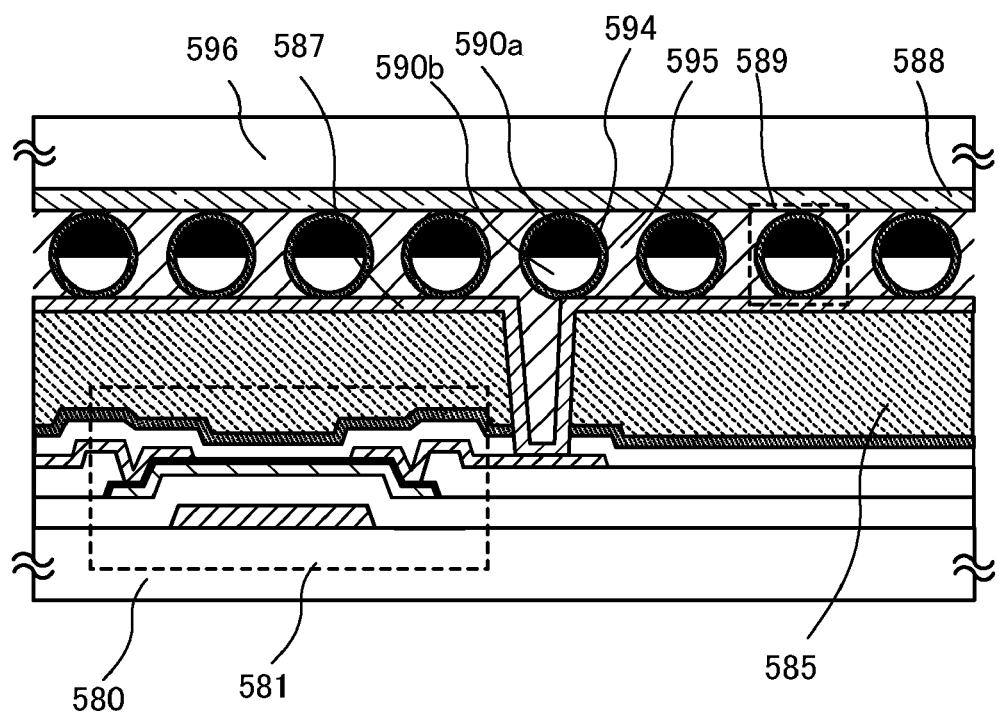
FIG. 8 is a cross-sectional view of a semiconductor device.

FIG. 8 illustrates active matrix electronic paper as an example of a semiconductor device. The transistor described in Embodiment 1 can be used as a transistor 581 for the semiconductor device.

The electronic paper in FIG. 8 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The transistor 581 formed over a first substrate 580 is a transistor with a bottom gate structure, and a source or drain electrode layer thereof is in contact with a first electrode layer 587 through an opening formed in an insulating layer 585, whereby the transistor 581 is electrically connected to the first electrode layer 587. Between the first electrode layer 587 and a second electrode layer 588 which is provided to a second substrate 596, spherical particles 589 are provided. The spherical particles 589 are surrounded by filler 595 formed of a material such as a resin. A cavity 594 in the spherical particle 589 is filled with liquid and also includes a particle having a black region 590*a* and a white region 590*b*. In this Embodiment, the first electrode layer 587 corresponds to a pixel electrode and the second electrode layer 588 corresponds to a common electrode (a counter electrode). The second electrode layer 588 is electrically connected to a common potential line provided over the same substrate as the transistor 581. With the use of any one of the common connection portions described in Embodiment 1, the second electrode layer 588 can be electrically connected to the common potential line through conductive particles provided between the pair of substrates.

Further, instead of the twisting ball, an electrophoretic element can also be used. A microcapsule having a diameter of approximately greater than or equal to 10 μm and less than or equal to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. A display element using this principle is an electrophoretic display element and is generally called electronic paper. The electrophoretic display element has higher reflectance than a liquid crystal display element, and thus, an auxiliary light is unnecessary. Moreover, power consumption is low, and a display portion can be recognized in a dim place. Further, even when power is not supplied to the display portion, an image which has been displayed once can be maintained. Accordingly, a displayed image can be stored even if a semiconductor device having a display function (which may simply be referred to as a display device or a semiconductor device provided with a display device) is disconnected from a power source.

Through this process, a highly reliable electronic paper as a semiconductor device can be manufactured.

Note that this embodiment can be freely combined with any of the other embodiments.

Embodiment 7

A semiconductor device to which the transistor described in Embodiment 1 is applied can be used as electronic paper. Electronic paper can be used for electronic appliances of a variety of fields as long as they can display data. For example, electronic paper can be applied to an electronic book reader (e-book), a poster, an advertisement in a vehicle such as a train, or displays of various cards such as a credit card. An example of an electronic appliance is illustrated in FIGS. 9A, 9B, and 10.

Figure 9A:
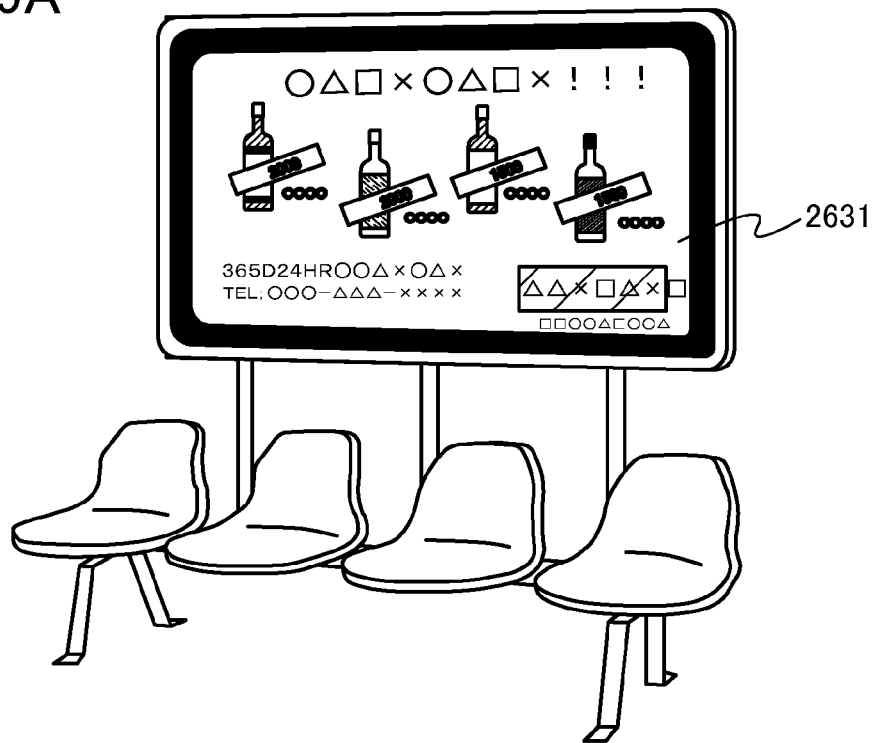
FIGS. 9A and 9B each illustrate an electronic device.

FIG. 9A illustrates a poster 2631 formed using electronic paper. In the case where an advertising medium is printed paper, the advertisement is replaced by hands; however, by using the electronic paper, the advertising display can be changed without replacement of the poster 2631 itself. Furthermore, stable images can be obtained without display defects. Note that the poster may have a configuration capable of wirelessly transmitting and receiving data.

Figure 9B:
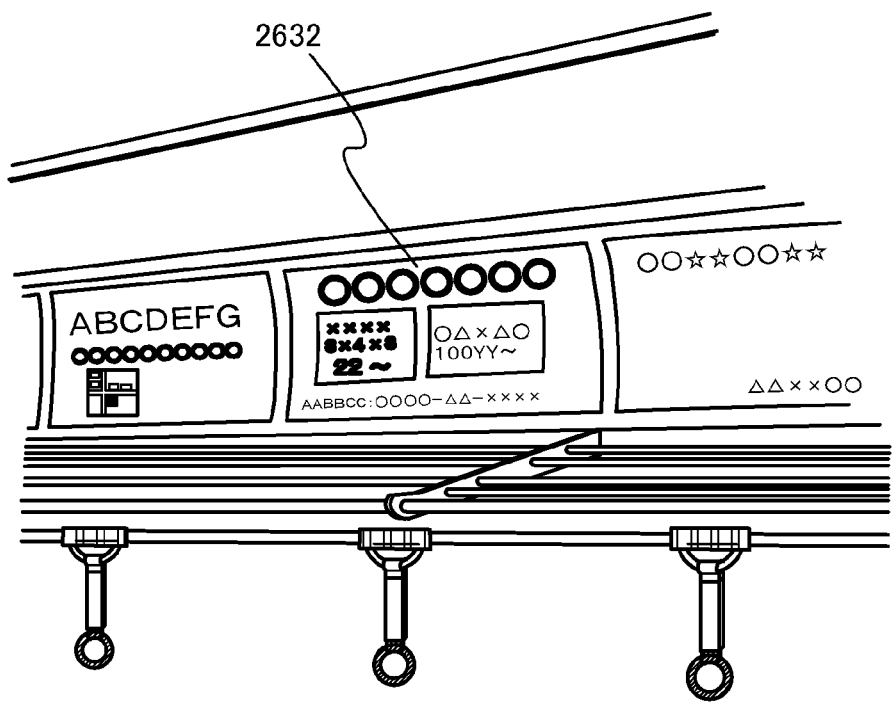

FIG. 9B illustrates an advertisement 2632 in a vehicle such as a train. In a case where an advertising medium is printed paper, the advertisement is replaced by hands; however, by using the electronic paper, much manpower is not needed and the advertising display can be changed without replacement of the poster 2632 itself. Furthermore, stable images can be obtained without display defects. Note that the advertisement in a vehicle may have a configuration capable of wirelessly transmitting and receiving data.

Figure 10:
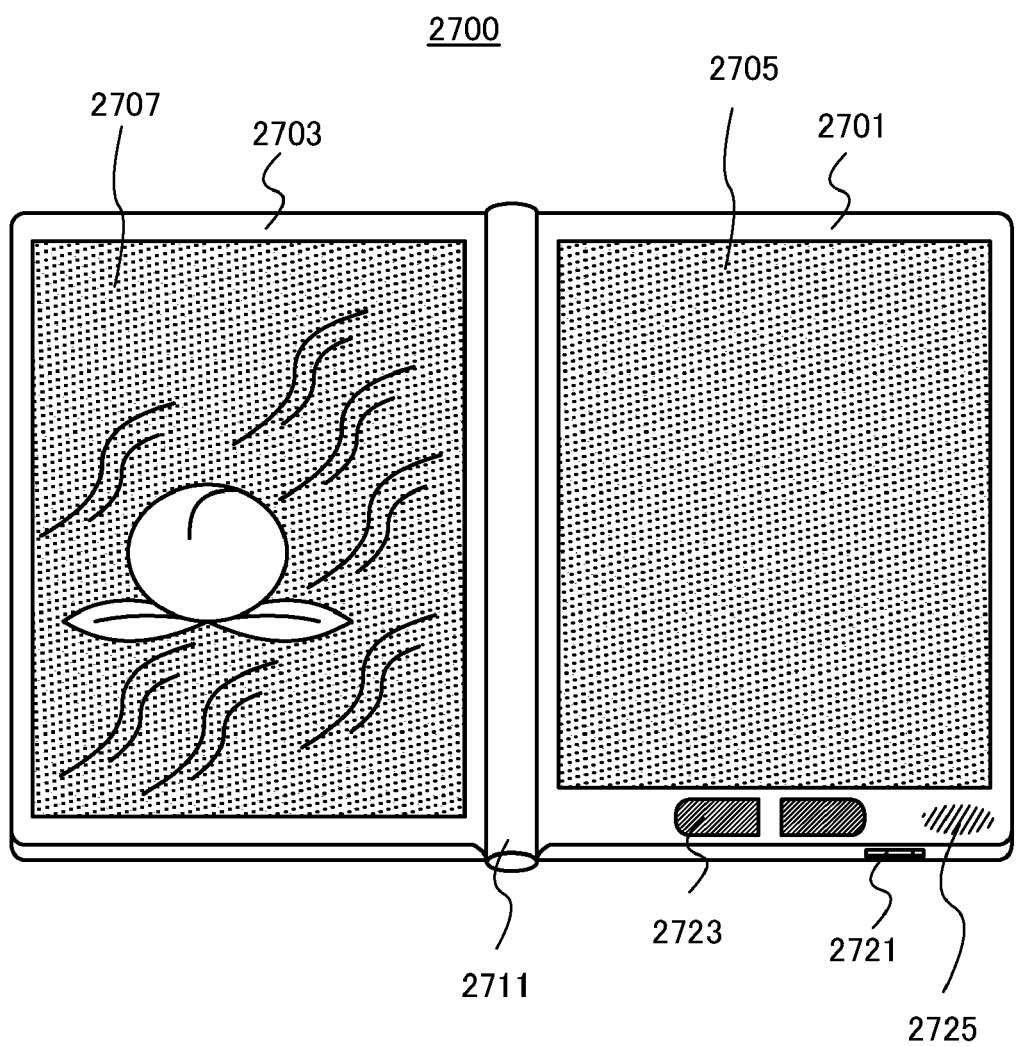
FIG. 10 illustrates an electronic device.

FIG. 10 illustrates an example of an electronic book reader. For example, an electronic book reader 2700 includes two housings, a housing 2701 and a housing 2703. The housings 2701 and 2703 are bound with each other by an axis portion 2711, along which the electronic book reader 2700 is opened and closed. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the structure where different images are displayed in different display portions, for example, the right display portion (the display portion 2705 in FIG. 10) can display text and the left display portion (the display portion 2707 in FIG. 10) can display an image.

FIG. 10 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Further, an external connection terminal (an earphone terminal, a USB terminal, a terminal that can be connected to any cable such as a power cable or any other signal cable, or the like), a recording medium insert portion, and the like may be provided on the back surface or the side surface of the housings 2701 and 2702. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Note that the structure described in this embodiment can be combined with any of the structures described in other embodiments as appropriate.

Embodiment 8

A semiconductor device using the transistor described in Embodiment 1 can be applied to a variety of electronic appliances (including an amusement machine). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 11A:
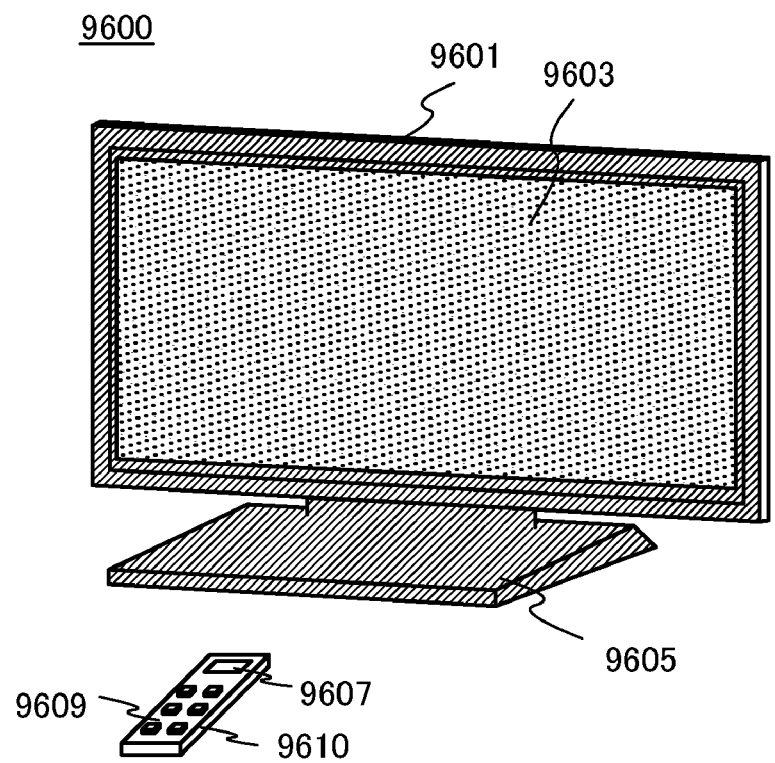
FIGS. 11A and 11B each illustrate an electronic device.

FIG. 11A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels can be switched and volume can be controlled with operation keys 9609 of the remote controller 9610 so that an image displayed on the display portion 9603 can be controlled. Further, the remote controller 9610 may be provided with a display portion 9607 for displaying data output from the remote controller 9610.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 11B:
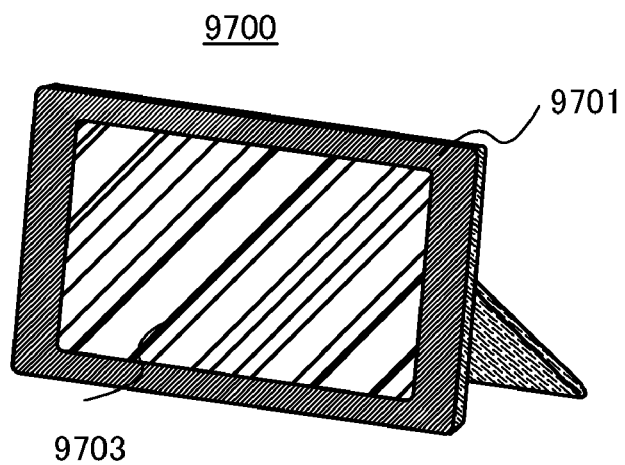

FIG. 11B illustrates an example of a digital photo frame. For example, in a digital photo frame 9700, a display portion 9703 is incorporated in a housing 9701. The display portion 9703 can display a variety of images. For example, the display portion 9703 can display data of an image taken with a digital camera or the like and function as a normal photo frame.

Note that the digital photo frame 9700 is provided with an operation portion, an external connection terminal (e.g., a USB terminal), an external memory slot, and the like. Although these components may be provided on the surface on which the display portion is provided, it is preferable to provide them on the side surface or the back surface for the design of the digital photo frame 9700. For example, a memory storing data of an image taken with a digital camera is inserted in the external memory slot of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 12A:
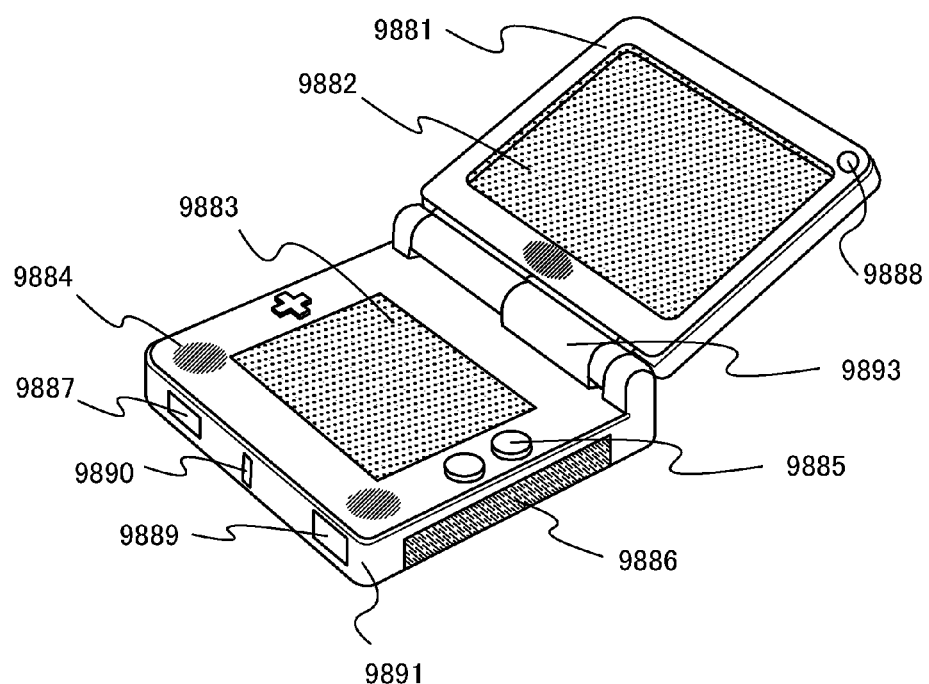
FIGS. 12A and 12B each illustrate an electronic device.

FIG. 12A is a portable game console including two housings, a housing 9881 and a housing 9891. The housings 9881 and 9891 are connected with a connection portion 9893 so as to be opened and closed. A display portion 9882 and a display portion 9883 are incorporated in the housing 9881 and the housing 9891, respectively. Moreover, the portable game console illustrated in FIG. 12A is provided with a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable game console is not limited to the above structure, and other structures provided with at least a semiconductor device according to the present invention may be employed. The portable game console may include other accessory equipment as appropriate. The portable game console in FIG. 12A has a function of reading a program or data stored in a recording medium to display it on the display portions, and a function of sharing information with another portable game console by wireless communication. Note that the portable game console illustrated in FIG. 12A is not limited to those described above, and the portable game console can have a variety of functions.

Figure 12B:
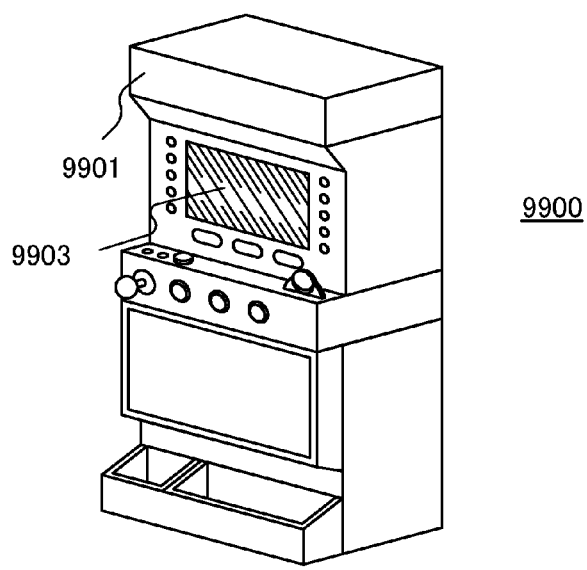

FIG. 12B illustrates an example of a slot machine which is a large-sized game machine. In a slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above structure and other structures provided with at least a semiconductor device according to the present invention may be employed. The slot machine 9900 may include other accessory equipment as appropriate.

Figure 13A:
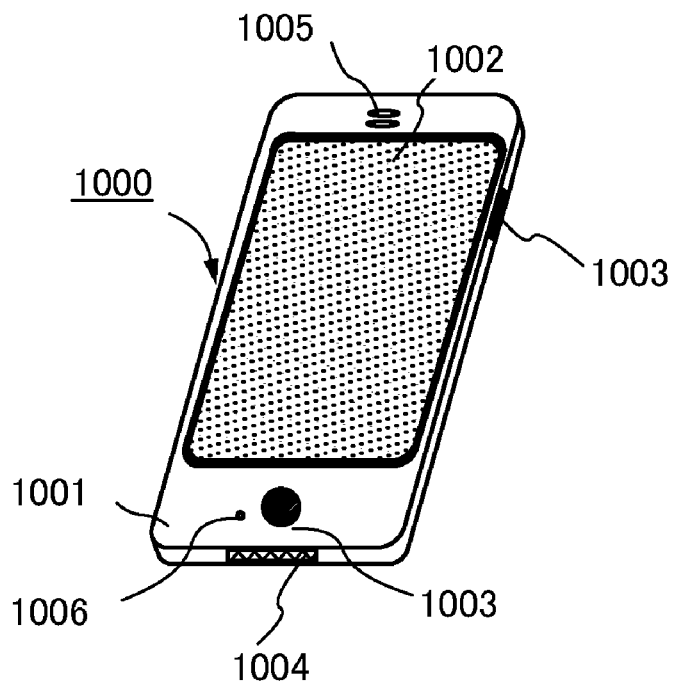
FIGS. 13A and 13B each illustrate an electronic device.

FIG. 13A illustrates an example of a mobile phone handset. A mobile phone handset 1000 includes a display portion 1002 incorporated in a housing 1001, an operation button 1003, an external connection port 1004, a speaker 1005, a microphone 1006 and the like.

When the display portion 1002 of the mobile phone handset 1000 illustrated in FIG. 13A is touched with a finger or the like, data can be input into the mobile phone handset 1000. Further, operations such as making calls and sending and receiving mails can be performed by touching the display portion 1002 with a finger or the like.

There are mainly three screen modes of the display portion 1002. The first mode is a display mode mainly for displaying images. The second mode is an input mode mainly for inputting data such as text. The third mode is a display-and-input mode in which two modes of the display mode and the input mode are combined.

For example, in the case of making a call or composing a mail message, a text input mode mainly for inputting text is selected for the display portion 1002 so that text displayed on a screen can be input. In that case, it is preferable to display a keyboard or number buttons on almost all area of the screen of the display portion 1002.

When a detection device including a sensor for detecting inclination, such as a gyroscope or an acceleration sensor, is provided inside the mobile phone handset 1000, display in the screen of the display portion 1002 can be automatically switched by determining the installation direction of the mobile phone handset 1000 (whether the mobile phone handset 1000 is placed horizontally or vertically).

The screen modes are changed by touching the display portion 1002 or using the operation buttons 1003 of the housing 1001. Alternatively, the screen modes may be switched depending on the kind of the image displayed on the display portion 1002. For example, when a signal of an image displayed on the display portion is a signal of moving image data, the screen mode is switched to the display mode. When the signal is a signal of text data, the screen mode is switched to the input mode.

Further, in the input mode, when input by touching the display portion 1002 is not performed for a certain period while a signal detected by the optical sensor in the display portion 1002 is detected, the screen mode may be controlled so as to be switched from the input mode to the display mode.

The display portion 1002 may function as an image sensor. For example, an image of a palm print, a fingerprint, or the like is taken when the display portion 1002 is touched with a palm or a finger, whereby personal identification can be performed. Further, by providing a backlight or a sensing light source which emits a near-infrared light in the display portion, an image of a finger vein, a palm vein, or the like can be taken.

Figure 13B:
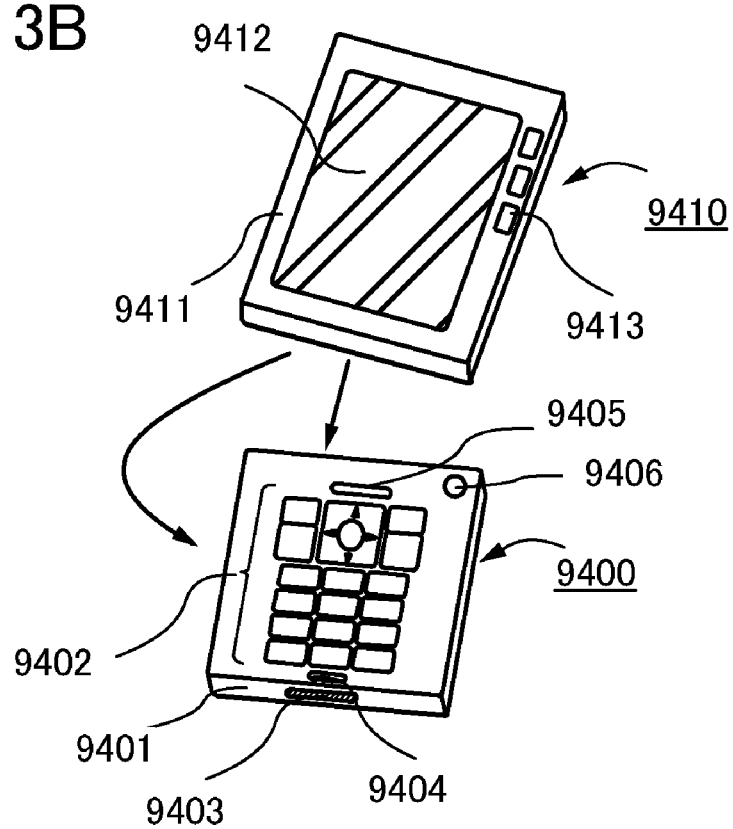

FIG. 13B illustrates another example of a mobile phone handset. The mobile phone handset in FIG. 13B includes an a display device 9410 in which a display portion 9412 and operation buttons 9413 are included in a housing 9411, and a communication device 9400 in which operation buttons 9402, an external input terminal 9403, a microphone 9404, a speaker 9405, and a light-emitting portion 9406 that emits light when a phone call is received are included in a housing 9401. The display device 9410 having a display function can be detached from or attached to the communication device 9400 having a telephone function in two directions as indicated by arrows. Thus, a minor axis of the display device 9410 can be attached to a minor axis of the communication device 9400, and a major axis of the display device 9410 can be attached to a major axis of the communication device 9400. In addition, when only the display function is needed, the display device 9410 can be detached from the communication device 9400 and used alone. The communication device 9400 and the display device 9410 can transmit and receive images or input information to/from each other by wireless communication or wired communication, and each of the communication device 9400 and the display device 9410 has a rechargeable battery.

Note that this embodiment can be freely combined with any of the other embodiments.

This application is based on Japanese Patent Application serial no. 2009-236780 filed with Japan Patent Office on Oct. 14, 2009, the entire contents of which are hereby incorporated by reference.

EXPLANATION OF REFERENCE

400: substrate, 402: gate insulating layer, 403: gate insulating layer, 404: oxide semiconductor layer, 404a: microcrystal group, 405a: microcrystal group, 405: oxide semiconductor layer, 417: conductive layer, 422: source wiring layer, 426: oxide insulating layer, 427: oxide insulating layer, 428: protective insulating layer, 430: capacitor wiring layer, 431: capacitor electrode layer, 432: storage wiring layer, 440: transistor, 442: connection electrode layer, 443: channel formation region, 448: connection electrode layer, 449: connection electrode layer, 452: connection electrode layer, 453: color filter layer, 456: planarization insulating layer, 457: pixel electrode layer, 458: overcoat layer, 459: partition wall, 460: transistor, 421a: gate electrode layer, 421b: gate electrode layer, 421c: gate wiring layer, 444c: first region, 444d: second region, 445a: source electrode layer, 445b: drain electrode layer, 446a: oxide conductive layer, 446b: oxide conductive layer, 451 a: gate electrode layer, 451b: gate electrode layer, 455a: source electrode layer, 455b: drain electrode layer, 457a: pixel electrode layer, 457b: first electrode, 581: transistor, 585: insulating layer, 587: first electrode layer, 588: second electrode layer, 589: spherical particle, 594: cavity, 595: filler, 590a: black region, 590b; white region, 1000: mobile phone handset, 1001: housing, 1002: display portion, 1003: operation button, 1004: external connection port, 1005: speaker, 1006: microphone, 2600: substrate, 2601: counter substrate, 2602: sealant, 2603: pixel portion, 2604: display element, 2605: coloring layer, 2606: polarizing plate, 2607: polarizing plate, 2608: wiring circuit portion, 2609: flexible wiring board, 2610: cold cathode tube, 2611: reflective plate, 2612: circuit substrate, 2613: diffusion plate, 2631: poster, 2632: advertisement in vehicle, 2700: electronic book reader, 2701: housing, 2703: housing, 2705: display portion, 2707: display portion, 2711: hinge, 2721: power switch, 2723: operation key, 2725: speaker, 4001: substrate, 4002: pixel portion, 4003: signal line driver circuit portion, 4004: scan line driver circuit portion, 4005: sealant, 4006: substrate, 4008: liquid crystal layer, 4010: transistor, 4011: transistor, 4013: liquid crystal element, 4015: connection terminal electrode, 4016: terminal electrode, 4018: FPC, 4019: anisotropic conductive film, 4020: protective insulating layer, 4021: insulating layer, 4030: pixel electrode, 4031: counter electrode, 4032: insulating layer, 4033: insulating layer, 4035: spacer, 4040: conductive layer, 4041: insulating layer, 4501: substrate, 4502: pixel portion, 4505: sealant, 4506: substrate, 4507: filler, 4509: transistor, 4510: transistor, 4511: light-emitting element, 4512: electroluminescent layer, 4513: electrode layer, 4515: connection terminal electrode, 4516: terminal electrode, 4517: first electrode, 4519: anisotropic conductive film, 4520: partition wall, 4540: conductive layer, 4541: oxide insulating layer, 4542: oxide insulating layer, 4543: insulating layer, 4544: insulating layer, 4545: insulating layer, 4546: insulating layer, 4548: source wiring, 4503a: signal line driver circuit portion, 4503b: signal line driver circuit portion, 4504a: scan line driver circuit portion, 4504b: scan line driver circuit portion, 4518a FPC, 4518b: FPC, 9400: communication device, 9401: housing, 9402: operation button, 9403: external input terminal, 9404, microphone, 9405: speaker, 9406: light-emitting portion, 9410: display device, 9411: housing, 9412: display portion, 9413: operation button, 9600: television set, 9601: housing, 9603: display portion, 9605: stand, 9607: display portion, 9609: operation key, 9610: remote controller, 9700: digital photo frame, 9701: housing, 9703: display portion, 9881: housing, 9882: display portion, 9883: display portion, 9884: speaker portion, 9885: operation key, 9886: storage medium inserting portion, 9887:

connection terminal, 9888: sensor, 9889: microphone, 9890: LED lamp, 9891: housing, 9893: connector, 9900: slot machine, 9901: housing, and 9903: display portion.

The invention claimed is:
1. A semiconductor device comprising:
a pixel portion including a first transistor and a driver circuit portion including a second transistor, the pixel portion and the driver circuit portion being provided over a substrate,
the first transistor and the second transistor each comprising:
a gate electrode layer;
a gate insulating layer over the gate electrode layer;
an oxide semiconductor layer over the gate insulating layer;
a source electrode layer and a drain electrode layer over the oxide semiconductor layer; and
an oxide insulating layer over the oxide semiconductor layer, the source electrode layer, and the drain electrode layer, the oxide insulating layer being in contact with the oxide semiconductor layer,
a first gate wiring formed from a same layer as the gate electrode layer of the first transistor;
a second gate wiring formed from a same layer as the gate electrode layer of the second transistor; and
a connection wiring formed from a same layer as the source electrode layer and the drain electrode layer of the second transistor, and in electrical contact with the first gate wiring through the second gate wiring,
wherein the gate electrode layer, the source electrode layer, and the drain electrode layer of the first transistor comprise an oxide conductive layer, and
wherein the gate electrode layer, the source electrode layer, and the drain electrode layer of the second transistor comprise a metal layer.
2. The semiconductor device according to claim 1, wherein the oxide conductive layer has a light-transmitting property.
3. The semiconductor device according to claim 1, wherein the metal layer comprises an element selected from Ti, Mo, W, Al, Cr, Cu, and Ta.
4. The semiconductor device according to claim 1, wherein the second transistor further comprises a second oxide conductive layer between the oxide semiconductor layer and the source electrode layer and between the oxide semiconductor layer and the drain electrode layer.
5. The semiconductor device according to claim 1, wherein the oxide insulating layer comprises silicon oxide, silicon nitride oxide, aluminum oxide, or aluminum oxynitride.
6. The semiconductor device according to claim 1, wherein the second transistor further comprises a conductive layer over the oxide insulating layer, and
wherein the conductive layer overlaps with the gate electrode layer.
7. The semiconductor device according to claim 1, further comprising a storage capacitor in the pixel portion,
wherein the storage capacitor is formed by a capacitor wiring layer, a dielectric over the capacitor wiring layer, and a capacitor electrode layer over the dielectric,
wherein the capacitor wiring layer comprises a layer formed from a same layer as the gate electrode layer of the first transistor,
wherein the dielectric comprises a layer formed from a same layer as the gate insulating layer of the first transistor,
wherein the capacitor electrode layer comprises a layer formed from a same layer as the source electrode layer and the drain electrode layer of the first transistor, and
wherein a layer formed from a same layer as the semiconductor layer of the first transistor is interposed between the dielectric and the capacitor electrode layer.
8. The semiconductor device according to claim 1, further comprising:
a pixel electrode layer in the pixel portion, the pixel electrode layer being electrically connected to one of the source electrode layer and the drain electrode layer of the first transistor;
an planarization insulating layer interposed between the pixel electrode and the first transistor; and
a storage capacitor in the pixel portion,
wherein the storage capacitor is formed by a capacitor wiring layer, a dielectric over the capacitor wiring layer, and the pixel electrode layer,
wherein the capacitor wiring layer comprises a layer formed from a same layer as the source electrode layer and the drain electrode layer of the first transistor, and
wherein the dielectric comprises a layer formed from a same layer as the planarization insulating layer.
9. The semiconductor device according to claim 1,
wherein the first gate wiring and the connection wiring are both in direct contact with a top surface of the second gate wiring.
10. The semiconductor device according to claim 1,
wherein the oxide semiconductor layer comprises crystal regions including microcrystal groups of nanocrystals, the density in such crystal regions in a superficial layer of the oxide semiconductor being higher than in other layers of the oxide semiconductor layer.
11. A semiconductor device comprising:
a pixel portion including a first transistor and a storage capacitor over a substrate; and
a driver circuit portion including a second transistor over the substrate,
wherein the first transistor and the second transistor each comprise:
a gate electrode layer;
a gate insulating layer over the gate electrode layer;
an oxide semiconductor layer over the gate insulating layer;
a source electrode layer and a drain electrode layer over the oxide semiconductor layer; and
an oxide insulating layer over the oxide semiconductor layer, the source electrode layer, and the drain electrode layer, the oxide insulating layer being in contact with the oxide semiconductor layer,
a first gate wiring formed from a same layer as the gate electrode layer of the first transistor;
a second gate wiring formed from a same layer as the gate electrode layer of the second transistor; and
a connection wiring formed from a same layer as the source electrode layer and the drain electrode layer of the second transistor, and in electrical contact with the first gate wiring through the second gate wiring,
wherein the storage capacitor is formed by a capacitor wiring layer, a dielectric over the capacitor wiring layer, and a capacitor electrode layer over the dielectric,
wherein the gate electrode layer, the source electrode layer, and the drain electrode layer of the first transistor comprise an oxide conductive layer,
wherein the gate electrode layer, the source electrode layer, and the drain electrode layer of the second transistor comprise a metal layer, wherein the capacitor wiring layer comprises a layer formed from a same layer as the gate electrode layer of the first transistor, wherein the dielectric comprises a layer formed from a same layer as the gate insulating layer of the first transistor, and wherein the capacitor electrode layer comprises a layer formed from a same layer as the source electrode layer and the drain electrode layer of the first transistor.

12. The semiconductor device according to claim 11, wherein the oxide conductive layer has a light-transmitting property.

13. The semiconductor device according to claim 11, wherein the metal layer comprises an element selected from Ti, Mo, W, Al, Cr, Cu, and Ta.

14. The semiconductor device according to claim 11, wherein the second transistor further comprises a second oxide conductive layer between the oxide semiconductor layer and the source electrode layer and between the oxide semiconductor layer and the drain electrode layer.

15. The semiconductor device according to claim 11, wherein the oxide insulating layer comprises silicon oxide, silicon nitride oxide, aluminum oxide, or aluminum oxynitride.

16. The semiconductor device according to claim 11, wherein the second transistor further comprises a conductive layer over the oxide insulating layer, and wherein the conductive layer overlaps with the gate electrode layer.

17. The semiconductor device according to claim 11, wherein the first gate wiring and the connection wiring are both in direct contact with a top surface of the second gate wiring.

18. The semiconductor device according to claim 11, wherein the oxide semiconductor layer comprises crystal regions including microcrystal groups of nanocrystals, the density in such crystal regions in a superficial layer of the oxide semiconductor being higher than in other layers of the oxide semiconductor layer.

19. A semiconductor device comprising:
a pixel portion including a first transistor and a driver circuit portion including a second transistor, the pixel portion and the driver circuit portion being provided over a substrate, the first transistor and the second transistor each comprising:
a gate electrode layer;
a gate insulating layer over the gate electrode layer;
an oxide semiconductor layer over the gate insulating layer;
a source electrode layer and a drain electrode layer over the oxide semiconductor layer; and
an oxide insulating layer over the oxide semiconductor layer, the source electrode layer, and the drain electrode layer, the oxide insulating layer being in contact with the oxide semiconductor layer, a first gate wiring formed from a same layer as the gate electrode layer of the first transistor;
a second gate wiring formed from a same layer as the gate electrode layer of the second transistor;
a connection wiring formed from a same layer as the source electrode layer and the drain electrode layer of the second transistor, and in electrical contact with the first gate wiring through the second gate wiring,
a third gate wiring formed from a same layer as the gate electrode layer of the second transistor,
a source wiring formed from a same layer as the source electrode layer and the drain electrode layer of the first transistor, the source wiring overlapping the third gate wiring, and
an additional oxide insulating layer over the gate insulating layer and the oxide semiconductor layers,
wherein the gate insulating layer and the additional oxide insulating layer are interposed between the third gate wiring and the source wiring,
wherein the gate electrode layer, the source electrode layer, and the drain electrode layer of the first transistor comprise an oxide conductive layer, and
wherein the gate electrode layer, the source electrode layer, and the drain electrode layer of the second transistor comprise a metal layer.

20. The semiconductor device according to claim 19, wherein the oxide conductive layer has a light-transmitting property.

21. The semiconductor device according to claim 19, wherein the second transistor further comprises a second oxide conductive layer between the oxide semiconductor layer and the source electrode layer and between the oxide semiconductor layer and the drain electrode layer.

22. The semiconductor device according to claim 19, wherein the oxide insulating layer comprises silicon oxide, silicon nitride oxide, aluminum oxide, or aluminum oxynitride.

23. The semiconductor device according to claim 19, wherein the second transistor further comprises a conductive layer over the oxide insulating layer, and wherein the conductive layer overlaps with the gate electrode layer.

24. The semiconductor device according to claim 19, wherein the first gate wiring and the connection wiring are both in direct contact with a top surface of the second gate wiring.

25. The semiconductor device according to claim 19, wherein the oxide semiconductor layer comprises crystal regions including microcrystal groups of nanocrystals, the density in such crystal regions in a superficial layer of the oxide semiconductor being higher than in other layers of the oxide semiconductor layer.

* * * * *